United States Patent
Ikeda et al.

(10) Patent No.: US 9,379,138 B2
(45) Date of Patent: Jun. 28, 2016

(54) IMAGING DEVICE WITH DRIVE VOLTAGE DEPENDENT ON EXTERNAL LIGHT INTENSITY

(71) Applicant: SEMICONDUCTOR ENERGY LABORATORY CO., LTD., Atsugi-shi, Kanagawa-ken (JP)

(72) Inventors: Takayuki Ikeda, Kanagawa (JP); Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/332,905

(22) Filed: Jul. 16, 2014

(65) Prior Publication Data

US 2015/0021598 A1    Jan. 22, 2015

(30) Foreign Application Priority Data

Jul. 19, 2013 (JP) ................................. 2013-150414

(51) Int. Cl.
*H01L 27/146* (2006.01)
*H01L 27/12* (2006.01)
*H01L 29/786* (2006.01)

(52) U.S. Cl.
CPC ...... *H01L 27/1225* (2013.01); *H01L 27/14609* (2013.01); *H01L 27/14612* (2013.01); *H01L 29/7869* (2013.01)

(58) Field of Classification Search
CPC .................. H01L 27/14609; H01L 27/14612; H01L 27/1225; H01L 29/7869
USPC .......................................................... 257/43
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Peter Bradford
(74) *Attorney, Agent, or Firm* — Fish & Richardson P.C.

(57) ABSTRACT

A solid-state imaging device increases the SN ratio of a signal even when external light intensity is low. The solid-state imaging device includes a sensor circuit that includes a light-receiving element, a first transistor that controls connection between a first wiring and a node in which the amount of accumulated charge is determined by the amount of exposure to the light-receiving element, a second transistor whose on or off state is selected in accordance with the potential of the node, and a third transistor that controls connection between a second wiring and a third wiring together with the second transistor; a central processing unit that selects a first driving method or a second driving method in accordance with external light intensity; and a controller that controls a potential supplied to the gate of the first transistor in accordance with the first driving method or the second driving method.

14 Claims, 16 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,800,594 B2 | 9/2010 | Nakamura et al. |
| 8,378,391 B2 | 2/2013 | Koyama et al. |
| 8,716,712 B2 | 5/2014 | Kozuma et al. |
| 2001/0030704 A1 | 10/2001 | Kimura |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0071254 A1* | 4/2006 | Rhodes ................ 257/292 |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0267120 A1* | 10/2009 | Ackland et al. ................ 257/291 |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0108706 A1 | 5/2011 | Koyama |
| 2011/0128428 A1* | 6/2011 | Takatoku et al. ............. 348/307 |
| 2011/0176038 A1 | 7/2011 | Kurokawa et al. |
| 2011/0260059 A1* | 10/2011 | Jiang et al. .................... 250/330 |
| 2012/0050196 A1 | 3/2012 | Kurokawa |
| 2013/0015326 A1 | 1/2013 | Tamura |
| 2013/0015332 A1 | 1/2013 | Kozuma |
| 2013/0016035 A1 | 1/2013 | Ikeda |
| 2013/0044917 A1 | 2/2013 | Kurokawa |
| 2013/0285046 A1 | 10/2013 | Yamazaki |
| 2014/0291670 A1* | 10/2014 | Yamada et al. ................. 257/43 |
| 2014/0374745 A1 | 12/2014 | Takahashi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-0298663 | 10/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-243927 A | 9/2006 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

(56) References Cited

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers 2004, vol. 35, pp. 860-863.

Nomura.K et al., "Room-Temperature Fabrication of Transparent Flexible Thin-Film Transistors Using Amorpous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID International Symposium Digest of Technical Papers, 2007, vol. 38, pp. 1830-1833.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

(56) References Cited

OTHER PUBLICATIONS

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

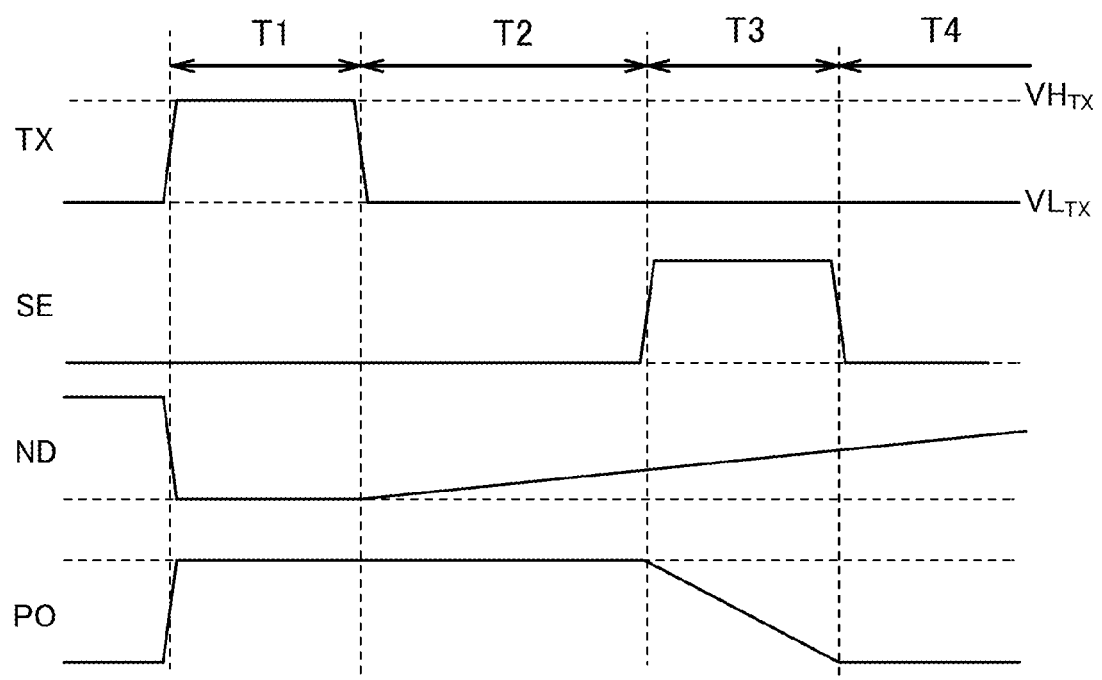

IMAGING DEVICE WITH DRIVE VOLTAGE DEPENDENT ON EXTERNAL LIGHT INTENSITY

BACKGROUND OF THE INVENTION

1. Field of the Invention

The present invention relates to semiconductor devices. In particular, the present invention relates to semiconductor devices such as solid-state imaging devices including light-receiving elements in pixels and semiconductor display devices including light-receiving elements and display elements in pixels.

2. Description of the Related Art

An optical solid-state imaging device (image sensor), which is a kind of position input device, obtains positional information by using light intensity; thus, when light intensity in an external environment is low, sensitivity for obtainment of positional information is low and a signal-noise ratio (SN ratio) tends to be low. Consequently, to remove noise from an obtained signal, it is necessary to devise signal processing hardware or a signal processing method.

In view of the problems, an optical solid-state imaging device that can obtain a signal with a high SN ratio even when light intensity is low is anticipated. Patent Document 1 discloses a display device that controls the sensitivity of an optical sensor adequately in accordance with external light by controlling at least one of the precharge voltage and exposure time of the optical sensor in accordance with the output value of the optical sensor.

REFERENCE

Patent Document 1: Japanese Published Patent Application No. 2006-243927

SUMMARY OF THE INVENTION

In the case where the sensitivity of an optical sensor is controlled by changing the length of exposure time as in the display device disclosed in Patent Document 1, it is necessary to adjust the cycle of turning on or off a transistor that controls timing of reading the amount of charge accumulated by exposure (specifically, an output control switch in Patent Document 1) in accordance with external light intensity. Thus, a circuit for controlling the operation of the optical sensor becomes complex.

In the case where the sensitivity of an optical sensor is controlled by changing precharge voltage as in the display device disclosed in Patent Document 1, precharge is performed in a specific cycle; thus, it is necessary to periodically initialize the amount of charge changed by exposure. Consequently, in the case where external light intensity becomes lower, it is difficult to control the sensitivity of the optical sensor adequately because a change in the amount of charge due to leakage current is too small.

In view of the above technical background, it is an object of one embodiment of the present invention to provide a solid-state imaging device that can increase the SN ratio of a signal containing image information even when the cycle of turning on or off a transistor that reads the amount of charge is not adjusted in accordance with external light intensity. It is an object of one embodiment of the present invention to provide a solid-state imaging device that can increase the SN ratio of a signal containing image information even when external light intensity is low. It is an object of one embodiment of the present invention to provide a semiconductor display device that is not influenced by noise and can obtain positional information even when external light intensity is low.

A solid-state imaging device according to one embodiment of the present invention includes a sensor circuit that includes a light-receiving element, a first transistor that has a function of controlling connection between a first wiring and a node in which the amount of accumulated charge is determined by the amount of exposure to the light-receiving element, a second transistor whose gate is connected to the node, and a third transistor that controls connection between a second wiring and a third wiring together with the second transistor. The solid-state imaging device according to one embodiment of the present invention further includes a central processing unit that selects a first driving method in which a first potential and a second potential that is higher than the first potential are alternately supplied to a gate of the first transistor or a second driving method in which a third potential that is higher than the first potential and lower than the second potential is supplied to the gate of the first transistor in accordance with external light intensity. Furthermore, the solid-state imaging device according to one embodiment of the present invention further includes a controller that controls a potential supplied to the gate of the first transistor in accordance with the first driving method or the second driving method selected by the central processing unit.

In one embodiment of the present invention, by the first driving method, the first transistor can be turned on and off alternately. Thus, in the case where the external light intensity satisfies a predetermined value, the amount of charge in the node that is changed by exposure can be initialized when the first transistor is on, and charge whose amount is based on the amount of exposure to the light-receiving element can be accumulated in the node when the first transistor is off.

Unlike in the first driving method, the amount of charge in the node is not initialized in the second driving method; thus, the amount of charge in the node is determined by the total amount of exposure to the light-receiving element. Thus, as compared with the case where the amount of charge in the node is initialized, a change in the amount of charge in the node can be large even when the external light intensity does not satisfy a predetermined value. Consequently, a signal with a high SN ratio can be read from the sensor circuit.

Note that the amount of charge in the node is not initialized in the second driving method; thus, as exposure time becomes longer, the anode-cathode voltage of the light-receiving element eventually converges on 0 V. In that case, the amount of change in the potential of the node is almost zero and it is difficult to read a change in the amount of exposure to the light-receiving element. Thus, in one embodiment of the present invention, in the second driving method, by supplying the third potential to the gate of the first transistor, the first transistor functions as a variable resistor whose source-drain resistance is controlled by the level of the third potential. With such a structure, the potential of the node is determined by a ratio of the anode-cathode resistance of the light-receiving element to the source-drain resistance of the first transistor; thus, anode-cathode voltage can be prevented from converging on 0 V. Consequently, signals containing the amount of exposure to the light-receiving element as information can be obtained consecutively even when the amount of charge in the node is not initialized.

According to one embodiment of the present invention, it is possible to provide a solid-state imaging device that can increase the SN ratio of a signal containing image information even when external light intensity is low. According to one embodiment of the present invention, it is possible to provide a solid-state imaging device that can increase the SN ratio of a signal containing image information even when the cycle of turning on or off a transistor that reads the amount of charge is not adjusted in accordance with external light intensity. According to one embodiment of the present invention, it is possible to provide a semiconductor display device that is not influenced by noise and can obtain positional information even when external light intensity is low.

BRIEF DESCRIPTION OF THE DRAWINGS

In the accompanying drawings:

FIG. 2 is a timing chart of the pixel;

DETAILED DESCRIPTION OF THE INVENTION

Figure 1A:
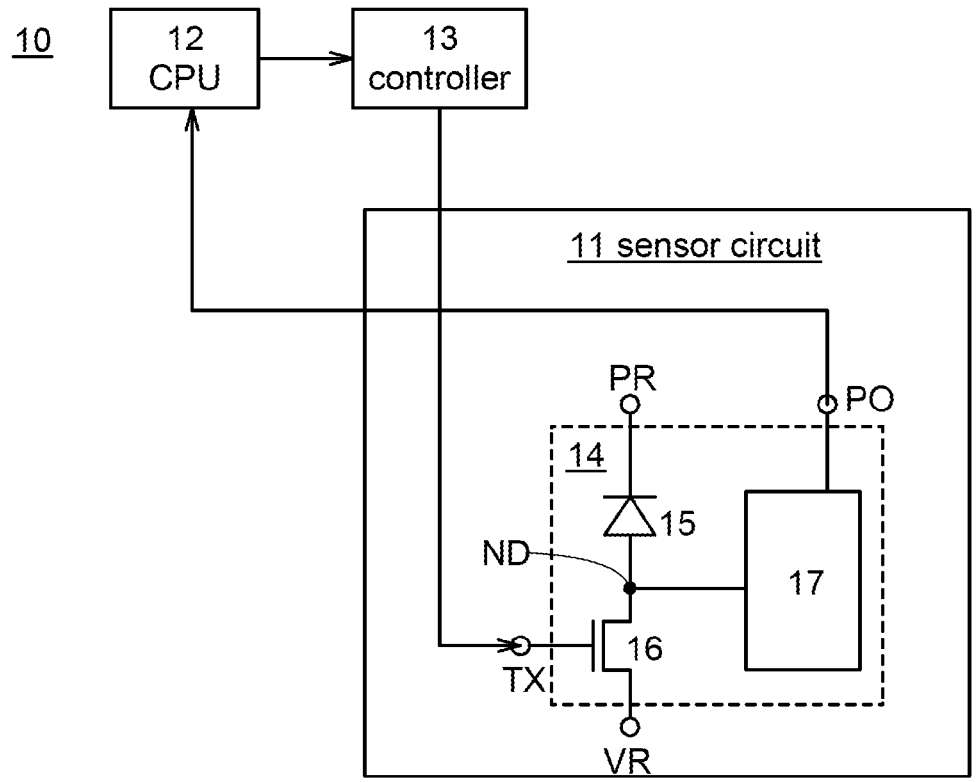
FIG. 1A illustrates a structure example of a solid-state imaging device.

An embodiment of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiment.

Note that the present invention includes, in its category, all the semiconductor devices that include solid-state imaging devices: for example, integrated circuits, RF tags, and semiconductor display devices. The integrated circuit includes, in its category, large scale integrated circuits (LSI) including a microprocessor, an image processing circuit, a digital signal processor (DSP), and a microcontroller and programmable logic devices (PLD) such as a field programmable gate array (FPGA) and a complex PLD (CPLD). Furthermore, the semiconductor display device includes, in its category, semiconductor display devices in which solid-state imaging devices are included in driver circuits, such as liquid crystal display devices, light-emitting devices in which a light-emitting element typified by an organic light-emitting element is provided in each pixel, electronic paper, digital micromirror devices (DMD), plasma display panels (PDP), and field emission displays (FED).

Note that in this specification, the term "connection" means electrical connection and corresponds to a state where current, voltage, or a potential can be supplied or transmitted. Accordingly, a connection state does not always mean a direct connection state but includes an electrical connection state through a circuit element such as a wiring, a resistor, a diode, or a transistor so that current, voltage, or a potential can be supplied or transmitted.

A source of a transistor means a source region that is part of a semiconductor film functioning as an active layer or a source electrode that is electrically connected to the semiconductor film. Similarly, a drain of a transistor means a drain region that is part of a semiconductor film functioning as an active layer or a drain electrode that is electrically connected to the semiconductor film. A gate means a gate electrode.

The terms "source" and "drain" of a transistor interchange with each other depending on the channel type of the transistor or levels of potentials applied to terminals. In general, in an n-channel transistor, a terminal to which a low potential is applied is called a source, and a terminal to which a high potential is applied is called a drain. Furthermore, in a p-channel transistor, a terminal to which a low potential is applied is called a drain, and a terminal to which a high potential is applied is called a source. In this specification, although the connection relationship of the transistor is described assuming that the source and the drain are fixed in some cases for convenience, actually, the names of the source and the drain interchange with each other depending on the relationship of the potentials.

<Structure Example of Solid-State Imaging Device>

FIG. 1A illustrates a structure example of a solid-state imaging device according to one embodiment of the present invention. A solid-state imaging device 10 in FIG. 1A includes a sensor circuit 11, a central processing unit (CPU) 12, and a controller 13.

The sensor circuit 11 has a function of generating a signal containing the amount of exposure to the sensor circuit 11 as information, i.e., a signal containing image information. Specifically, the sensor circuit 11 includes one or more pixels 14 each including a light-receiving element 15, a transistor 16, and an amplifier circuit 17. As the light-receiving element 15, it is possible to use a photoelectric conversion element such as a photodiode that generates current when light enters a semiconductor junction.

The transistor 16 has a function of controlling electrical connection between a node ND in which charge is accumulated by current generated in the light-receiving element 15 and a wiring VR. For example, in the case where the transistor 16 is an n-channel transistor, the transistor 16 operates in a linear region when voltage of a gate with respect to a source of the transistor 16, i.e., gate voltage of the transistor 16, is much higher than the threshold voltage. Thus, the potential of the wiring VR is supplied to the node ND to initialize the potential of the node ND. The transistor 16 operates in a cut-off region when the gate voltage of the transistor 16 is much lower than the threshold voltage. Consequently, charge accumulated in the node ND is held.

The transistor 16 operates in a saturation region when the gate voltage of the transistor 16 is lower than the gate voltage in the linear region and higher than the gate voltage in the cut-off region. Thus, the source-drain resistance of the transistor 16 is determined by the gate voltage. Consequently, the potential of the node ND is determined by the ratio of the anode-cathode resistance of the light-receiving element 15 to the source-drain resistance of the transistor 16.

The amplifier circuit 17 has a function of amplifying the amount of change in the potential of the node ND. Specifically, the amplifier circuit 17 determines a potential supplied to a wiring PO in accordance with the potential of the node ND. Thus, a signal containing the potential of the wiring PO includes the amount of exposure to the light-receiving element 15 as information. Note that the structure of the amplifier circuit 17 may be any structure as long as the amplifier circuit 17 can have a function of amplifying the amount of change in the potential of the node ND.

The central processing unit 12 has a function of selecting a first driving method in which the transistor 16 is turned on and off alternately, preferably a first driving method in which the transistor 16 operates in the cut-off region and the linear region alternately, or a second driving method in which the transistor 16 operates in such a manner that high drain current flows as compared with the case where the transistor 16 is off in the first driving method, preferably a second driving method in which the transistor 16 operates in the saturation region. The central processing unit 12 can select the driving method in accordance with external light intensity.

Specifically, when determining that the external light intensity is high, the central processing unit 12 selects the first driving method. After the central processing unit 12 selects the first driving method, the transistor 16 is turned on and off alternately; thus, accumulation of charge in the node ND in accordance with the amount of exposure to the light-receiving element 15 and initialization of the potential of the node ND are performed alternately. Thus, a signal output from the pixel 14 in the sensor circuit 11 includes the amount of exposure to the light-receiving element 15 in a period from initialization of the potential of the node ND to the next initialization of the potential of the node ND as information.

When determining that the external light intensity is low, the central processing unit 12 selects the second driving method. After the central processing unit 12 selects the second driving method, the transistor 16 can operate in the saturation region consecutively. Accordingly, accumulation of charge in the node ND in accordance with the amount of exposure to the light-receiving element 15 is performed consecutively. Thus, a signal output from the pixel 14 in the sensor circuit 11 contains the total amount of exposure to the light-receiving element 15 while the second driving method is selected as information.

The controller 13 has a function of controlling a potential supplied to the gate of the transistor 16 in the pixel 14 included in the sensor circuit 11 in accordance with the first driving method or the second driving method selected by the central processing unit 12. Specifically, in the case where the first driving method is selected, the controller 13 can control the gate voltage of the transistor 16 so that the transistor 16 is turned on and off repeatedly by controlling the potential of a wiring TX connected to the gate of the transistor 16. In the case where the second driving method is selected, the controller 13 can control the gate voltage of the transistor 16 so that the transistor 16 operates in the saturation region consecutively by controlling the potential of the wiring TX connected to the gate of the transistor 16.

Figure 1B:
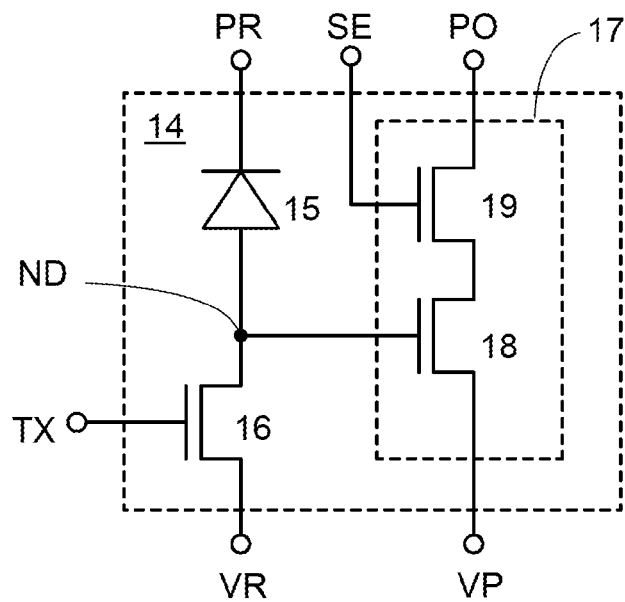
FIG. 1B illustrates a structure example of a pixel in the solid-state imaging device.

FIG. 1B illustrates a specific circuit structure example of the pixel 14. The pixel 14 in FIG. 1B includes the light-receiving element 15, the transistor 16, and the amplifier circuit 17 like the pixel 14 in FIG. 1A. In the pixel 14 in FIG. 1B, the amplifier circuit 17 includes transistors 18 and 19.

The source-drain resistance of the transistor 18 is determined by the potential of the node ND. The transistors 19 and 18 have a function of controlling electrical connection between the wiring PO and a wiring VP. Thus, when the transistor 19 operates in the linear region or the saturation region, the value of the source-drain resistance of the transistor 18 is reflected in the potential of the wiring PO. When the transistor 19 operates in the cut-off region, the value of the source-drain resistance of the transistor 18 is not reflected in the potential of the wiring PO.

Specifically, in the pixel 14, the cathode of the light-receiving element 15 is connected to a wiring PR and the anode of the light-receiving element 15 is connected to the node ND. The gate of the transistor 16 is connected to the wiring TX. One of the source and the drain of the transistor 16 is connected to the wiring VR. The other of the source and the drain of the transistor 16 is connected to the node ND. A gate of the transistor 18 corresponds to the node ND. One of the source and the drain of the transistor 18 is connected to the wiring VP. The other of the source and the drain of the transistor 18 is connected to one of a source and a drain of the transistor 19. A gate of the transistor 19 is connected to a wiring SE. The other of the source and the drain of the transistor 19 is connected to the wiring PO.

Note that to hold charge in the node ND more reliably, a capacitor connected to the node ND may be provided in the pixel 14.

Although in the pixel 14, the transistor 19 is provided between the wiring PO and the transistor 18, the transistor 19 may be provided between the wiring VP and the transistor 18.

In addition, although in the pixel 14, the wiring VR is electrically isolated from the wiring VP, the wiring VR may be electrically connected to the wiring VP. In that case, the wiring VP can be regarded as part of the wiring VR.

In FIG. 1B, each transistor has the gate electrode only on one side of a semiconductor film. In the case where each transistor has a pair of gate electrodes that sandwiches the semiconductor film, potentials at the same level may be applied to the pair of gate electrodes, or a fixed potential such as a ground potential may be applied only to one of the gate electrodes. By controlling the level of a potential applied to the one of the gate electrodes, the threshold voltage of each transistor can be controlled.

Note that in FIG. 1B, for the semiconductor films of the transistors 16, 18, and 19, oxide semiconductors or the following semiconductors other than oxide semiconductors may be used: amorphous silicon, microcrystalline silicon, polycrystalline silicon, single crystal silicon, amorphous germanium, microcrystalline germanium, polycrystalline germanium, single crystal germanium, and the like. By using the same semiconductor material for the semiconductor films of all the transistors in the pixel 14, a process can be simplified.

In particular, the off-state current of the transistor 16 is preferably low because the transistor 16 has a function of holding charge accumulated in the node ND. A transistor including a channel formation region in a film of an oxide semiconductor having a wider band gap and lower intrinsic carrier density than silicon can have significantly lower off-state current than a transistor formed using a normal semiconductor such as silicon or germanium; thus, such a transistor is preferably used as the transistor 16. When a semiconductor material that provides higher mobility than an oxide semiconductor, such as polycrystalline or single crystal silicon, is used for the semiconductor films of the transistors 18 and 19, signals can be read from the pixel 14 at high speed.

Note that unless otherwise specified, off-state current in this specification means current that flows in a cut-off region between a source and a drain of a transistor.

<Pixel Operation Example>

Next, operation examples of the pixel 14 in FIG. 1B are described.

First, an example of the first driving method is described with reference to a timing chart in FIG. 2.

Note that to clarify the operation of the pixel 14 in the timing chart in FIG. 2, all the transistors 16, 18, and 19 are n-channel transistors. In addition, the wiring VR is electrically connected to the wiring VP, and a low-level potential VSS is supplied to the wirings VR and VP and a high-level potential VDD is supplied to the wiring PR in periods T1 to T4.

First, as illustrated in FIG. 2, in the period T1, a high-level potential $VH_{TX}$ is supplied to the wiring TX. The potential $VH_{TX}$ preferably turns on the transistor 16, more preferably makes the transistor 16 operate in the linear region. Specifically, in the case where the transistor 16 is an n-channel transistor, the potential $VH_{TX}$ is determined so that voltage obtained by subtraction of the threshold voltage from the gate voltage of the transistor 16 is higher than the source-drain voltage of the transistor 16. In the case where the transistor 16 is a p-channel transistor, the potential of the wiring TX is determined so that the voltage obtained by subtraction of the threshold voltage from the gate voltage of the transistor 16 is lower than the source-drain voltage of the transistor 16. Thus, the potential VSS of the wiring VR is supplied to the node ND through the transistor 16 to initialize the potential of the node ND.

In the period T1, the low-level potential is supplied to the wiring SE. Thus, the transistor 19 operates in the cut-off region.

In the period T1, after the high-level potential is supplied to the wiring PO, the wiring PO is kept floating, i.e., electrically isolated from another electrode or another wiring.

Then, as illustrated in FIG. 2, in the period T2, a low-level potential $VL_{TX}$ is supplied to the wiring TX. The potential $VL_{TX}$ turns off the transistor 16, i.e., makes the transistor 16 operate in the cut-off region. Specifically, in the case where the transistor 16 is an n-channel transistor, the potential $VL_{TX}$ is determined so that the gate voltage of the transistor 16 is lower than gate voltage at which drain current rises. In the case where the transistor 16 is a p-channel transistor, the potential of the wiring TX is determined so that the gate voltage of the transistor 16 is higher than the gate voltage at which drain current rises. Thus, the transistor 16 operates in the cut-off region.

Figure 15:
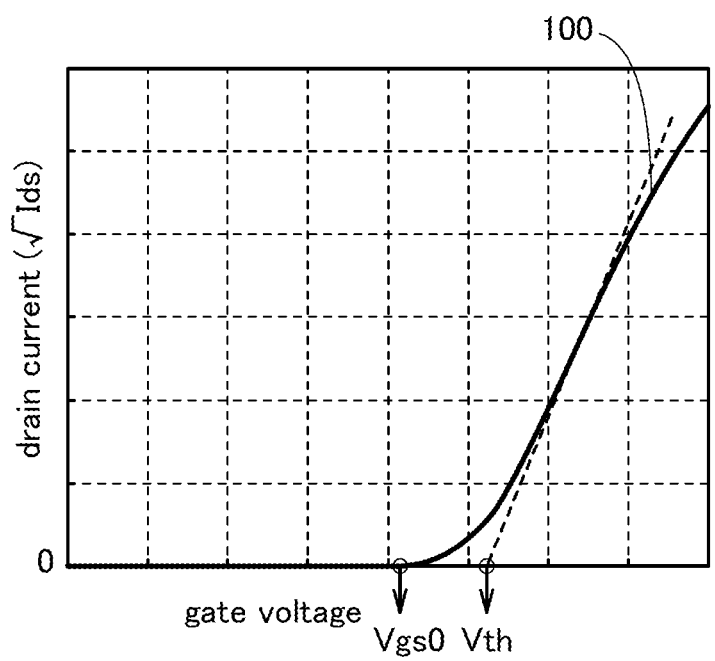
FIG. 15 is a graph showing relationship between gate voltage and drain current.

Note that FIG. 15 is a graph showing relationship between gate voltage and drain current of an n-channel transistor. In FIG. 15, gate voltage is plotted on a linear scale on the horizontal axis, and a square root of drain current (hereinafter also referred to as √Ids) is plotted on a linear scale on the vertical axis. A curve 100 corresponds to a curve in which a drain current value is represented by a square root. In a tangent in which a derivative value of the curve 100 is maximized, gate voltage in the case of √Ids=0 corresponds to threshold voltage Vth. In the curve 100, gate voltage at the beginning of increase in √Ids corresponds to gate voltage Vgs0 at which drain current rises.

At the beginning of the period T2, the node ND is kept at the potential VSS and the high-level potential is supplied to the wiring PR; thus, reverse biased voltage is applied to the light-receiving element 15. If light enters the light-receiving element 15 while reverse biased voltage is applied to the light-receiving element 15, current flows from the cathode to the anode of the light-receiving element 15. The current value varies depending on light intensity. Specifically, as the intensity of light that enters the light-receiving element 15 becomes higher, the current value and the amount of charge that flows into the node ND become larger. In contrast, as the intensity of light that enters the light-receiving element 15 becomes lower, the current value and the amount of charge that flows into the node ND become smaller. Thus, the potential of the node ND is changed when the light-receiving element 15 receives light. As the exposure amount becomes larger, the change in the potential of the node ND becomes larger. As the exposure amount becomes smaller, the change in the potential of the node ND becomes smaller.

In the period T2, the low-level potential is supplied to the wiring SE. Thus, the transistor 19 operates in the cut-off region, so that the potential of the wiring PO is kept high regardless of the operating state of the transistor 18.

Next, as illustrated in FIG. 2, in the period T3, the low-level potential $VL_{TX}$ is supplied to the wiring TX; thus, the transistor 16 operates in the cut-off region continuously. In the period T3, the high-level potential is supplied to the wiring SE. Thus, the transistor 19 operates in the linear region or the saturation region, so that current flows between the source and the drain of the transistor 18 in accordance with the potential of the node ND. Since the current flows between the wiring VP and the wiring PO through the transistor 19, the potential of the wiring PO is gradually decreased in accordance with the value of the current that flows between the source and the drain of the transistor 18.

Then, as illustrated in FIG. 2, in the period T4, the low-level potential $VL_{TX}$ is supplied to the wiring TX; thus, the transistor 16 operates in the cut-off region continuously. In the period T4, the low-level potential is supplied to the wiring SE; thus, the transistor 19 operates in the cut-off region. Consequently, charge transfer between the wirings VP and PO is stopped, so that the change in the potential of the wiring PO is stopped. The amount of exposure to the light-receiving element 15 in the periods T2 and T3 is reflected in the potential of the wiring PO in the period T4.

Through the series of operations, a signal containing the amount of exposure to the light-receiving element 15 as information can be obtained. To obtain the signal again after the period T4, the operations in the periods T1 to T4 are repeated.

Note that in the first driving method, the high-level potential VDD is supplied to the wiring PR in the periods T1 to T4; however, the high-level potential VDD may be supplied to the wiring PR in the period T2, and the low-level potential VSS may be supplied to the wiring PR in the period T1 or T3.

Next, an example of the second driving method is described with reference to a timing chart in FIG. 3.

Figure 3:
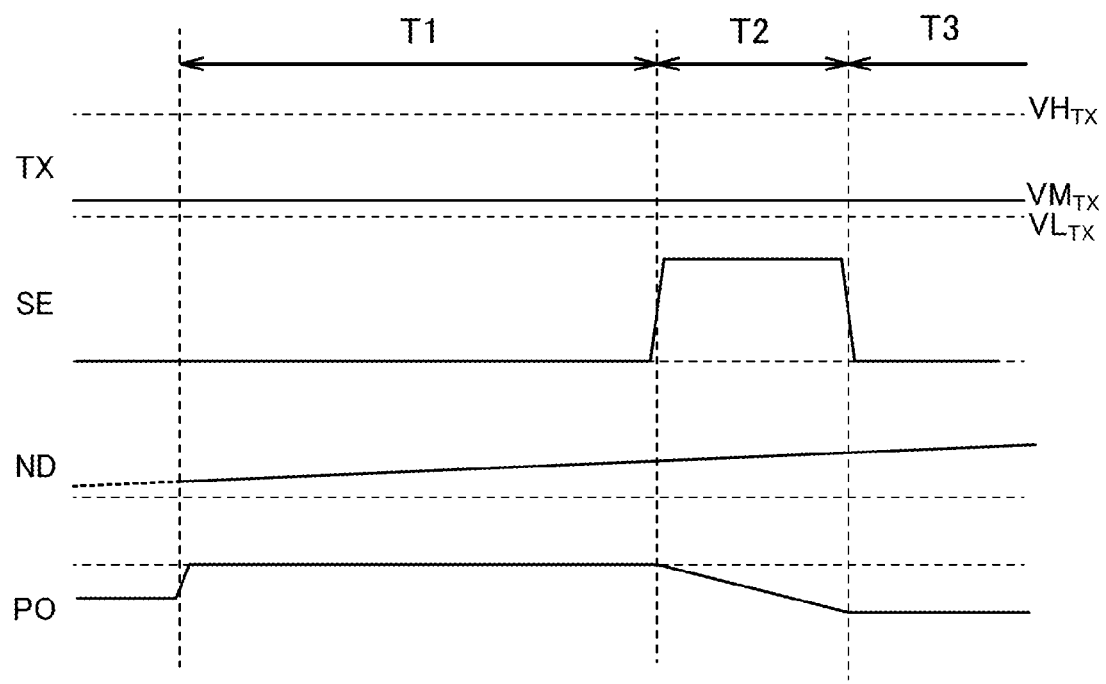
FIG. 3 is a timing chart of the pixel.

Note that to clarify the operation of the pixel 14 in the timing chart in FIG. 3, all the transistors 16, 18, and 19 are n-channel transistors. In addition, the wiring VR is electrically connected to the wiring VP, and the low-level potential VSS is supplied to the wirings VR and VP and the high-level potential VDD is supplied to the wiring PR in periods T1 to T3.

In the second driving method, in the periods T1 to T3, an intermediate potential $VM_{TX}$ that is lower than the high-level potential $VH_{TX}$ and higher than the low-level potential $VL_{TX}$ is supplied to the wiring TX. Specifically, the potential $VM_{TX}$ preferably makes the transistor 16 operate in the saturation region. In the case where the transistor 16 is an n-channel transistor, the potential $VM_{TX}$ is determined so that the voltage obtained by subtraction of the threshold voltage from the gate voltage of the transistor 16 is equal to or lower than the source-drain voltage of the transistor 16. In the case where the transistor 16 is a p-channel transistor, the potential of the wiring TX is determined so that the voltage obtained by subtraction of the threshold voltage from the gate voltage of the transistor 16 is equal to or higher than the source-drain voltage of the transistor 16.

First, as illustrated in FIG. 3, in the period T1, the transistor 16 operates in such a manner that the source-drain resistance Rsd of the transistor 16 has a desired value, as described above. Specifically, the transistor 16 preferably operates in the saturation region. The resistance Rsd is determined by the value of the potential $VM_{TX}$ supplied to the wiring TX. In addition, the anode-cathode resistance Vp of the light-receiving element 15 is determined by the amount of exposure to the light-receiving element 15. Thus, if exposure to the light-receiving element 15 is started at the beginning of the period T1, the potential V0 of the node ND at the beginning of the period T1 is determined by voltage between the wirings VR and PR and the ratio of the resistance Rsd to the resistance Vp.

At the beginning of the period T1, the node ND has the potential V0 and a high-level potential that is higher than the potential V0 is supplied to the wiring PR; thus, reverse biased voltage is applied to the light-receiving element 15. Then, current flows from the cathode to the anode of the light-receiving element 15 in accordance with the exposure amount. The potential of the node ND is changed when the light-receiving element 15 receives light.

For example, a current of approximately $1.0 \times 10^{-14}$ A flows to the light-receiving element 15 and a current of approximately $0.5 \times 10^{-14}$ A flows between the source and the drain of the transistor 16. Note that if voltage between the wirings VR and PR is fixed, current that flows to the light-receiving element 15 is determined by the amount of exposure to the light-receiving element 15, and current that flows between the source and the drain of the transistor 16 can be determined by the value of the potential $VM_{TX}$ of the wiring TX. In that case, current that flows to the gate of the transistor 18 through the node ND is approximately $0.5 \times 10^{-14}$ A (corresponding to a difference between the current that flows to the light-receiving element 15 and the current that flows between the source and the drain of the transistor 16). If the total capacitance of capacitances added to the node ND is approximately $10^{-14}$ F, it takes a period of approximately 0.1 s to change the potential of the node ND by 0.1 V.

Note that the transistor 16 preferably includes a channel formation region in an oxide semiconductor film. In a transistor that includes silicon in a channel formation region, it is difficult to control drain current to approximately $10^{-14}$ A by adjusting gate voltage. On the other hand, in a transistor that includes an oxide semiconductor in a channel formation region, it is possible to reduce drain current to approximately $10^{-23}$ A by adjusting gate voltage. Thus, it is easy for the transistor that includes an oxide semiconductor in the channel formation region to control the drain current to approximately $10^{-14}$ A by adjusting the potential of the wiring TX as compared with the transistor that includes silicon in the channel formation region.

In the period T1, after the high-level potential is supplied to the wiring PO, the wiring PO is kept floating, i.e., electrically isolated from another electrode or another wiring. The transistor 19 operates in the cut-off region, so that the potential of the wiring PO is kept high regardless of the operating state of the transistor 18.

Next, as illustrated in FIG. 3, in the period T2, the potential $VM_{TX}$ is supplied to the wiring TX; thus, the transistor 16 has the resistance Rsd continuously. Thus, the amount of charge accumulated in the node ND continuously changes in accordance with the amount of exposure to the light-receiving element 15, so that the potential of the node ND continuously changes in accordance with the exposure amount. In the period T2, the high-level potential is supplied to the wiring SE. Thus, the transistor 19 operates in the linear region or the saturation region, so that current flows between the source and the drain of the transistor 18 in accordance with the potential of the node ND. Since the current flows between the wiring VP and the wiring PO through the transistor 19, the potential of the wiring PO is gradually decreased in accordance with the value of the current that flows between the source and the drain of the transistor 18.

Then, as illustrated in FIG. 3, in the period T3, the potential $VM_{TX}$ is supplied to the wiring TX; thus, the transistor 16 operates in the saturation region continuously. In the period T3, the low-level potential is supplied to the wiring SE; thus, the transistor 19 operates in the cut-off region. Consequently, charge transfer between the wirings VP and PO is stopped, so that the change in the potential of the wiring PO is stopped. The amount of exposure to the light-receiving element 15 in the periods T1 and T2 is reflected in the potential of the wiring PO in the period T3.

Through the series of operations, a signal containing the amount of exposure to the light-receiving element 15 as information can be obtained. To obtain the signal again after the period T3, the operations in the periods T1 to T3 are repeated.

Unlike in the first driving method, the amount of charge in the node ND is not initialized in the second driving method; thus, the amount of charge in the node ND is determined by the total amount of exposure to the light-receiving element 15. As compared with the first driving method in which the amount of charge in the node ND is initialized, a change in the amount of charge in the node ND can be large even when the external light intensity does not satisfy a predetermined value. Thus, a signal with a high SN ratio can be read from the sensor circuit 11 even when the amount of exposure to the light-receiving element 15 is small.

Note that the amount of charge in the node ND is not initialized in the second driving method; thus, as exposure time becomes longer, the anode-cathode voltage of the light-receiving element 15 eventually converges on 0 V. In that case, the amount of change in the potential of the node ND is almost zero and it is difficult to read a change in the amount of exposure to the light-receiving element 15. Thus, in one embodiment of the present invention, in the second driving method, by supplying the potential $VM_{TX}$ to the gate of the transistor 16, the transistor 16 can function as a variable resistor whose source-drain resistance is controlled by the level of the potential $VM_{TX}$. With such a structure, the potential of the node ND is determined by the ratio of the anode-cathode resistance Vp of the light-receiving element 15 to the source-drain resistance Rsd of the transistor 16; thus, anode-cathode voltage can be prevented from converging on 0 V. Consequently, signals containing the amount of exposure to the light-receiving element 15 as information can be obtained consecutively even when the amount of charge in the node ND is not initialized.

Note that the external light intensity can be determined by using a signal that contains the amount of exposure to the light-receiving element 15 as information and is output from the pixel 14 in the sensor circuit 11. Specifically, if the first driving method is selected and the amount of exposure to the sensor circuit 11 is kept at the lowest level for a certain period, the central processing unit 12 determines that the external light intensity is low and can select the second driving method. If the second driving method is selected and the amount of exposure to the sensor circuit 11 is kept at the highest level for a certain period, the central processing unit 12 instructs the controller 13 to reduce the source-drain resistance Rsd of the transistor 16. The controller 13 controls the value of the potential $VM_{TX}$ supplied to the wiring TX in accordance with the instruction. If the amount of exposure to the sensor circuit 11 is kept at the highest level for a certain period and the potential $VM_{TX}$ of the wiring TX exceeds a predetermined value even when the operation is repeated, the central processing unit 12 determines that the external light intensity is high and can select the first driving method.

<Structure Example of Sensor Circuit>

Figure 4:
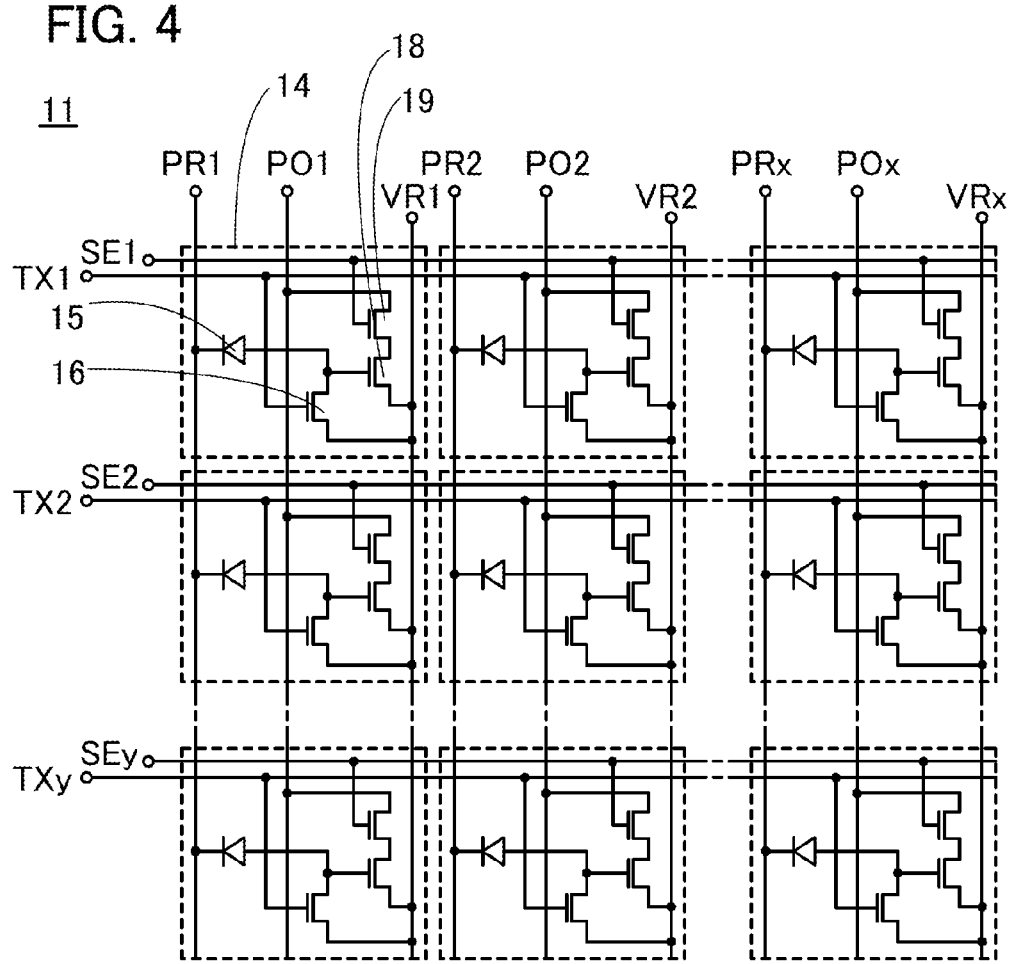
FIG. 4 illustrates a structure example of a sensor circuit.

Next, a structure example of the sensor circuit 11 according to one embodiment of the present invention is described. FIG. 4 illustrates a structure example of the sensor circuit 11 that includes the plurality of pixels 14 in FIG. 1B.

In the sensor circuit 11 in FIG. 4, the plurality of pixels 14 are arranged in matrix. The kinds and number of wirings in the sensor circuit 11 can be determined by the structure, number, and position of pixels 14. Specifically, in the sensor circuit 11 in FIG. 4, the pixels 14 are arranged in a matrix of x columns (x is a natural number of 2 or more)×y rows (y is a natural number of 2 or more). The pixels 14 in each column are connected to any one of a plurality of wirings PR1 to PRx, any one of a plurality of wirings PO1 to POx, and any one of a plurality of wirings VR1 to VRx. The pixels 14 in each row are connected to any one of a plurality of wirings TX1 to TXy and any one of a plurality of wirings SE1 to SEy.

Although FIG. 4 illustrates the structure of the sensor circuit 11 in which the wiring VR is electrically connected to the wiring VP and the wiring VP is part of the wiring VR, the wiring VR may be electrically isolated from the wiring VP.

Next, an operation example of the sensor circuit 11 in FIG. 4 is described with reference to a timing chart in FIG. 5. Note that in the timing chart in FIG. 5, all the transistors 16, 18, and 19 that are included in the pixel 14 are n-channel transistors.

Figure 5:
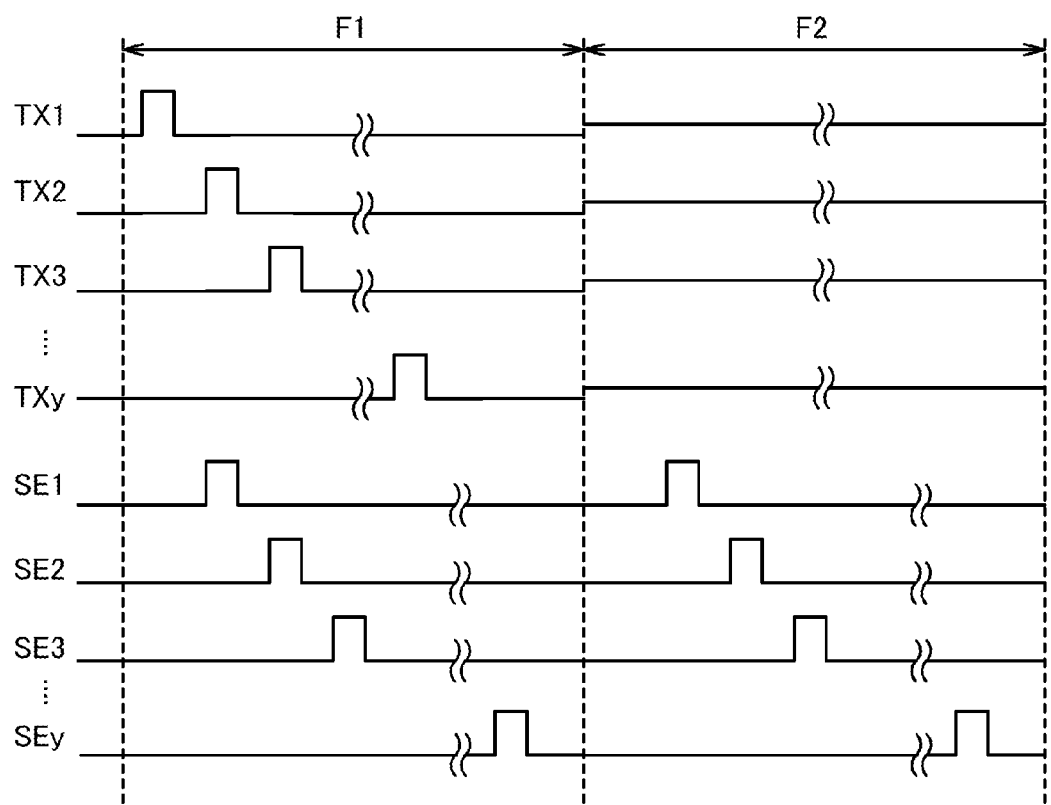
FIG. 5 is a timing chart of the sensor circuit.

In the timing chart in FIG. 5, the first driving method is employed in a period F1 and the second driving method is employed in a period F2.

In the period F1, the high-level potential $VH_{TX}$ is sequentially supplied to the wirings TX1 to TXy, so that charge in the node ND is sequentially initialized in the pixels 14 in each row. Then, the high-level potential is sequentially supplied to the wirings SE1 to SEy after the low-level potential $VL_{TX}$ is sequentially supplied to the wirings TX1 to TXy, so that a potential containing the amount of exposure to the light-receiving element 15 as information is sequentially supplied to the wirings PO1 to POx in the pixels 14 in each row. After the high-level potential is sequentially supplied to the wirings SE1 to SEy, the low-level potential is sequentially supplied to the wirings SE1 to SEy.

In the period F2, the intermediate potential $VM_{TX}$ is consecutively supplied to the wirings TX1 to TXy, so that charge is consecutively accumulated in the node ND in accordance with the amount of exposure to the light-receiving element 15. Then, the high-level potential is sequentially supplied to the wirings SE1 to SEy, so that a potential containing the amount of exposure to the light-receiving element 15 as information is sequentially supplied to the wirings PO1 to POx in the pixels 14 in each row. After the high-level potential is sequentially supplied to the wirings SE1 to SEy, the low-level potential is sequentially supplied to the wirings SE1 to SEy.

Note that an image can be taken with a solid-state imaging device by using external light and an image can also be taken by using not external light but light from a backlight, like a contact area sensor, for example. In the case where a backlight is used in one embodiment of the present invention, a plurality of light sources that emit light of different colors may be used in the backlight, and field sequential driving (FS driving) in which the light sources are sequentially turned on may be performed to obtain signals containing the exposure amount of light of the colors as information. By the FS driving, color image information can be obtained by additive color mixture using the plurality of signals containing the exposure amount of light of the plurality of colors. A backlight non-lighting period may be added, and image information may be obtained in the non-lighting period. By subtracting the image information obtained in the backlight non-lighting period from the color image information, high-contrast color image information with less influence of external light can be obtained.

<Specific Structure Example of Solid-State Imaging Device>

Figure 6:
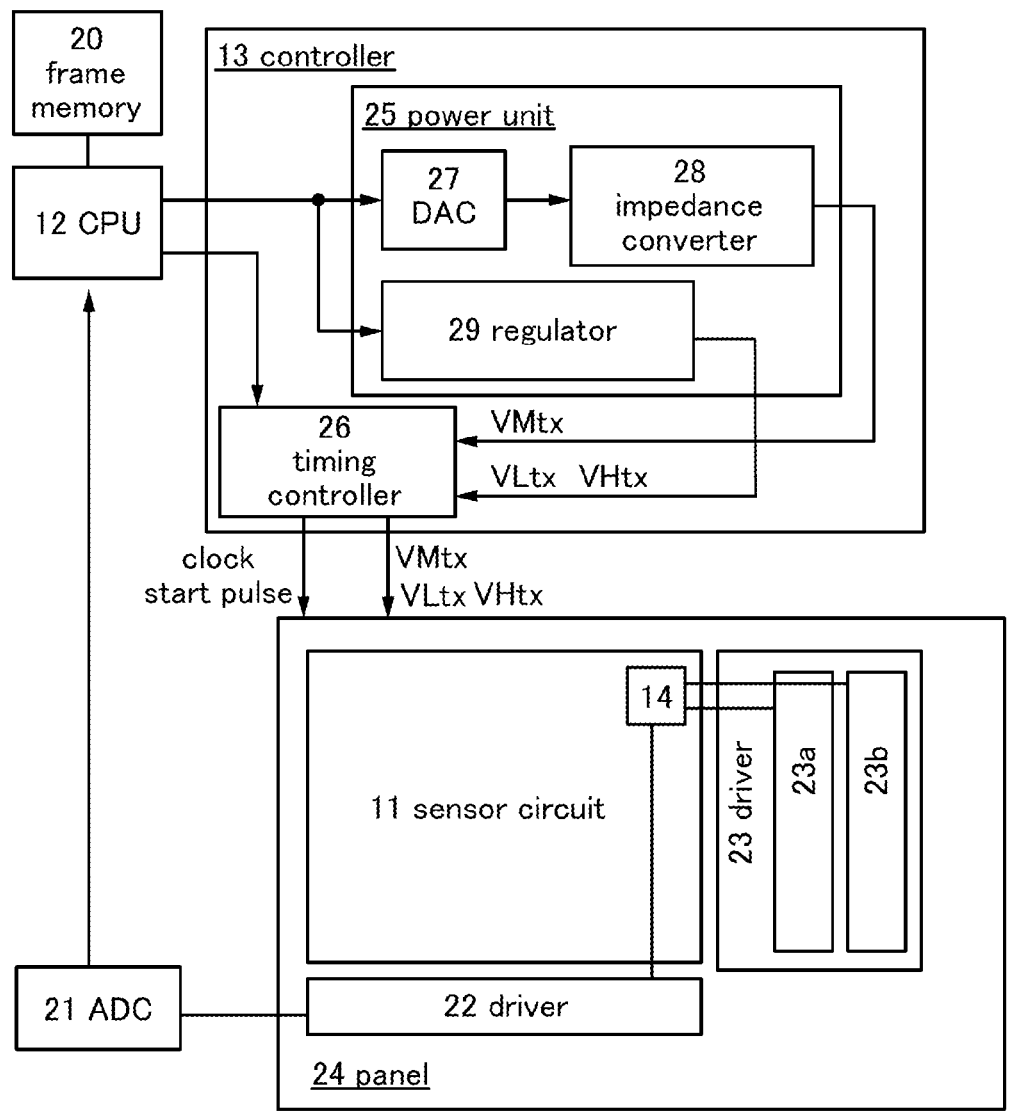
FIG. 6 illustrates a structure example of the solid-state imaging device.

Next, FIG. 6 is a block diagram illustrating a specific structure example of the solid-state imaging device 10 according to one embodiment of the present invention. Note that in the block diagram in FIG. 6, circuits in the solid-state imaging device 10 are classified by their functions and independent blocks are illustrated. However, it is difficult to classify actual circuits by their functions completely and, in some cases, one circuit has a plurality of functions.

As in the solid-state imaging device 10 in FIG. 1A, the solid-state imaging device 10 in FIG. 6 includes the sensor circuit 11, the central processing unit 12, and the controller 13. The solid-state imaging device 10 in FIG. 6 further includes a frame memory 20, an analog/digital converter (ADC) 21, and drivers 22 and 23. In FIG. 6, the sensor circuit 11 and the drivers 22 and 23 are provided in a panel 24.

The frame memory 20 has a function of storing image information input to the solid-state imaging device 10 or image information output from the sensor circuit 11. Note that although only one frame memory 20 is provided in the solid-state imaging device 10 in FIG. 6, the plurality of frame memories 20 may be provided in the solid-state imaging device 10. For example, the plurality of frame memories 20 for storing image information corresponding to hues of red, blue, green, and the like may be provided in the solid-state imaging device 10.

As the frame memory 20, for example, a storage circuit such as a dynamic random access memory (DRAM) or a static random access memory (SRAM) can be used. Alternatively, a video RAM (VRAM) may be used as the frame memory 20.

The drivers 22 and 23 each have a function of controlling the operation of the plurality of pixels 14 included in the sensor circuit 11. Specifically, the driver 23 includes a first driver 23a for selecting the wiring SE and a second driver 23b for selecting the wiring TX.

The analog/digital converter 21 has a function of converting an analog signal containing image information output from the panel 24 into a digital signal. The converted digital signal is stored in the frame memory 20 by the central processing unit 12.

The central processing unit 12 has a function of selecting the first driving method or the second driving method in accordance with image information supplied from the analog/digital converter 21. For example, in the case where the proportion of the pixels 14 with low-gradation image information to all the pixels 14 included in the sensor circuit 11 is lower than a predetermined proportion, the central processing unit 12 determines that external light intensity is high and can select the first driving method. In the case where the proportion of the pixels 14 with low-gradation image information to all the pixels 14 included in the sensor circuit 11 is higher than the predetermined proportion, the central processing unit 12 determines that external light intensity is low and can select the second driving method. Note that a criterion for determining whether image information obtained in the pixel 14 has low gradation can be determined by a designer as appropriate. In addition, a criterion for the proportion of the pixels 14 with low-gradation image information can be determined by the designer as appropriate.

Furthermore, when the central processing unit 12 selects the second driving method, the central processing unit 12 has a function of determining the value of the potential $VM_{TX}$ supplied to the pixel 14 and generating a signal containing information on the value.

The controller 13 includes a power unit 25 and a timing controller 26.

The power unit 25 has a function of generating potentials used for driving the sensor circuit 11 and the drivers 22 and 23 in accordance with the first or second driving method selected by the central processing unit 12. Specifically, in FIG. 6, the power unit 25 includes a digital/analog converter (DAC) 27, an impedance converter 28, and a regulator 29.

The regulator 29 has a function of generating the potentials $VH_{TX}$ and $VL_{TX}$. When the central processing unit 12 selects the first driving method, the potentials $VH_{TX}$ and $VL_{TX}$ are supplied to the timing controller 26.

The digital/analog converter 27 has a function of generating the potential $VM_{TX}$ from a signal containing the value of the potential $VM_{TX}$ as information when the central processing unit 12 selects the second driving method and generates the signal. The generated potential $VM_{TX}$ is supplied to the timing controller 26 through the impedance converter 28.

Note that the regulator 29 has a function of generating potentials used in the drivers 22 and 23 (excluding the potentials $VH_{TX}$, $VL_{TX}$, and $VM_{TX}$). These potentials are supplied to the timing controller 26 like the potentials $VH_{TX}$, $VL_{TX}$, and $VM_{TX}$.

The timing controller 26 has a function of generating drive signals used for driving the drivers 22 and 23 in accordance with the first or second driving method selected by the central processing unit 12. Examples of the drive signals include a start pulse signal SP and a clock signal CK for controlling the operation of the driver 22 or 23.

Note that the solid-state imaging device 10 in FIG. 6 may further include an input device having a function of inputting information or an instruction to the central processing unit 12. As the input device, a keyboard, a pointing device, a touch panel, or the like can be used. The central processing unit 12 may select the first driving method or the second driving method in the sensor circuit 11 in accordance with an instruction input from the input device.

<Specific Structure Example of Driver>

Figure 7A:
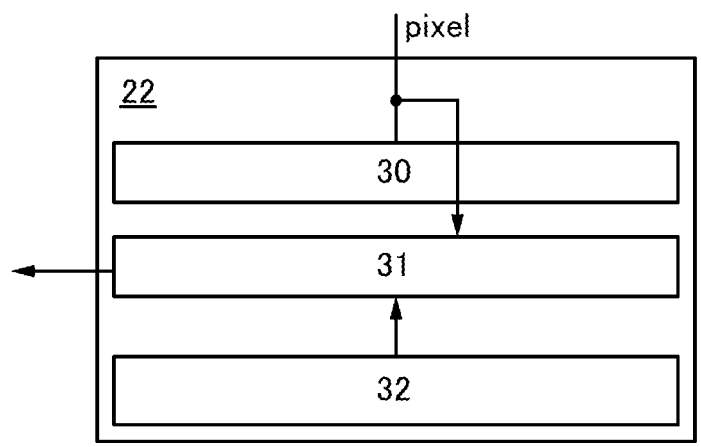
FIGS. 7A and 7B each illustrate a structure example of a driver.

Next, FIG. 7A is a block diagram illustrating a structure example of the driver 22 included in the solid-state imaging device 10 in FIG. 6. The driver 22 includes a precharge circuit 30, a switch circuit 31, and a shift register 32. The precharge circuit 30 has a function of initializing the potential of the wiring PO connected to the pixel 14 to a predetermined value. The shift register 32 has a function of generating a signal for selecting the pixels 14 column by column. The switch circuit 31 has a function of reading the potential of the wiring PO connected to the pixels 14 in the selected column in response to a signal generated in the shift register 32.

Note that to generate a signal for selecting the pixels 14 column by column, a decoder may be used instead of the shift register 32.

Figure 8:
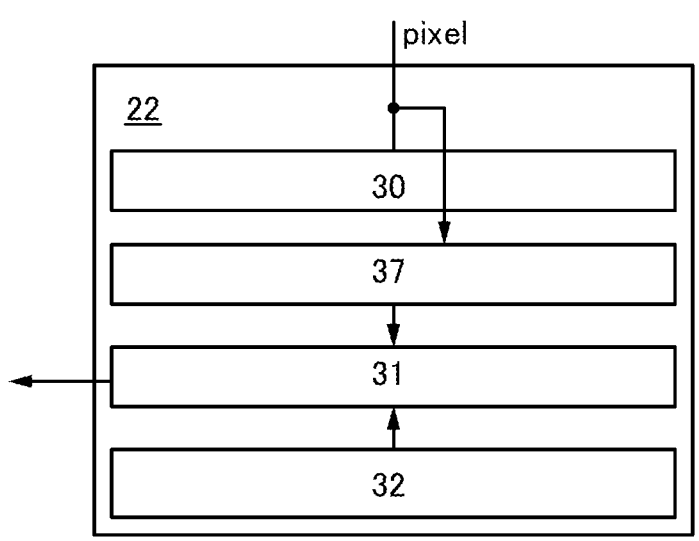
FIG. 8 illustrates a structure example of the driver.

The driver 22 may further include an analog/digital converter. FIG. 8 is a block diagram illustrating a structure example of the driver 22 that further includes an analog/digital converter 37. The analog/digital converter 37 included in the driver 22 in FIG. 8 has a function of converting an analog value of the potential of the wiring PO into a digital value. In the driver 22 in FIG. 8, the switch circuit 31 has a function of reading the digital value in response to a signal generated in the shift register 32.

Figure 7B:
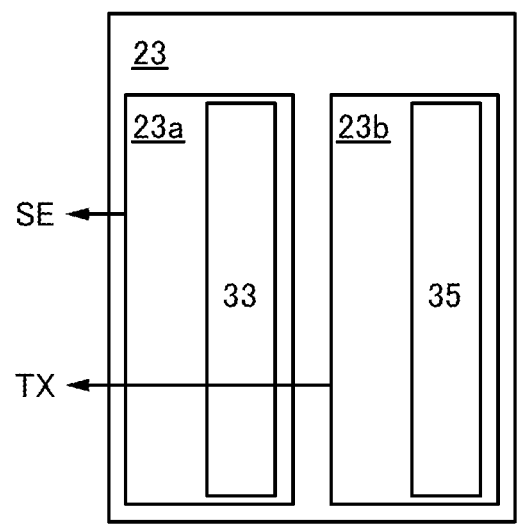

FIG. 7B is a block diagram illustrating a structure example of the driver 23 included in the solid-state imaging device 10 in FIG. 6. The driver 23 includes the first driver 23a for selecting the wiring SE and the second driver 23b for selecting the wiring TX.

The first driver 23a includes a shift register 33. The shift register 33 has a function of generating a signal for selecting the pixels 14 row by row, specifically, a signal for controlling the operating states of the transistors 19 included in the pixels 14 in a selected row. The generated signal is input to the wiring SE connected to the pixels 14 in the selected row. The first driver 23a may include a buffer in a subsequent stage of the shift register 33.

The second driver 23b includes a shift register 35. The shift register 35 has a function of generating a signal for selecting the pixels 14 row by row, specifically, a signal for controlling the operating states of the transistors 16 included in the pixels 14 in a selected row. The generated signal is input to the wiring TX connected to the pixels 14 in the selected row. The second driver 23b may include a buffer in a subsequent stage of the shift register 35.

Note that to generate a signal for selecting the pixels 14 row by row, a decoder may be used instead of the shift register 33 or 35.

<Specific Structure Example of Sequential Circuit>

Figure 9:
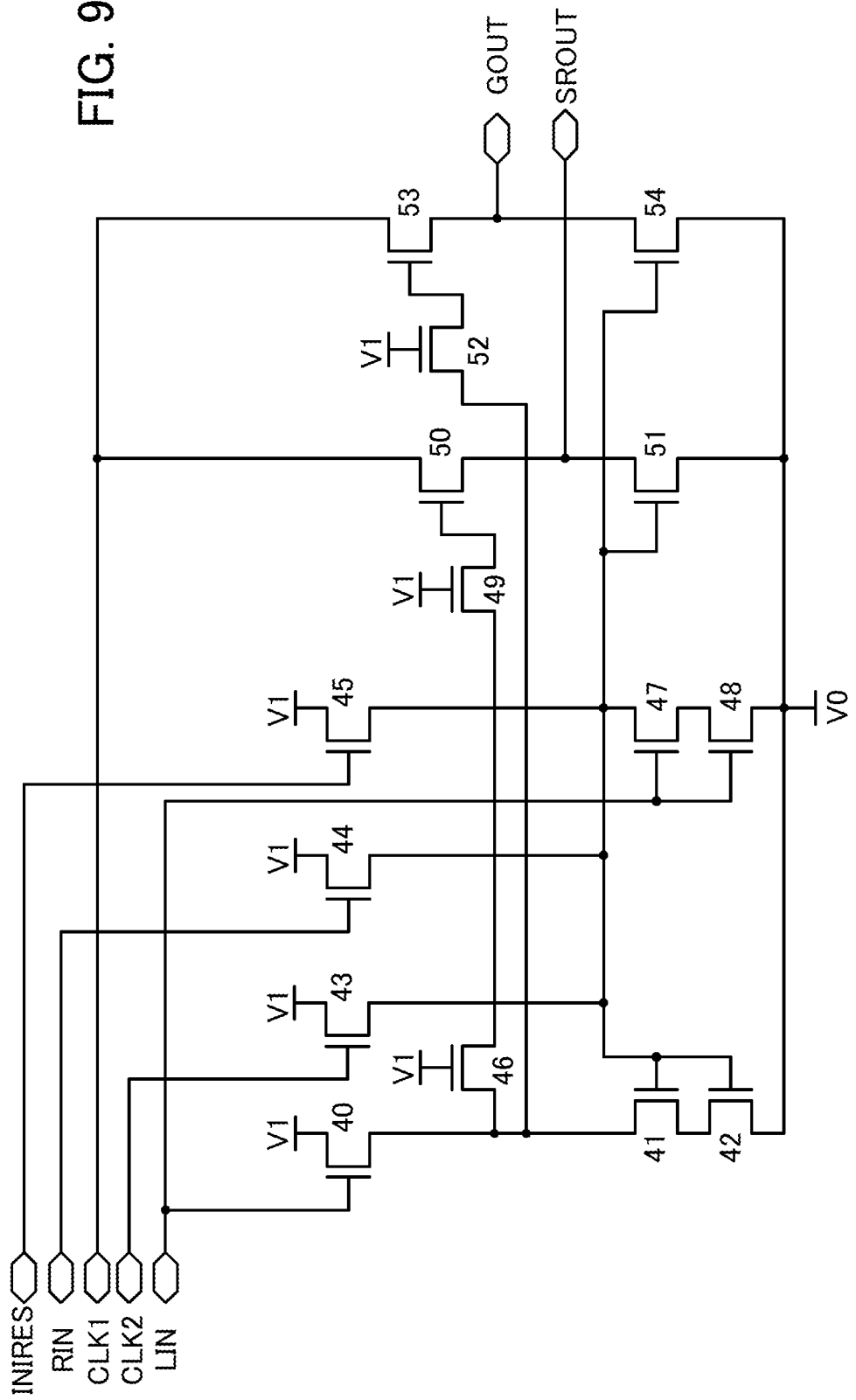
FIG. 9 illustrates a structure example of a sequential circuit.

Next, FIG. 9 illustrates a specific circuit structure example of a sequential circuit included in the shift register 35 of the second driver 23b. The shift register 35 can be constituted by connecting a plurality of sequential circuits in FIG. 9.

The sequential circuit in FIG. 9 includes transistors 40 to 54. A signal LIN is input to gates of the transistors 40, 47, and 48. A potential V1 is supplied to one of a source and a drain of each of the transistors 40, 43, 44, and 45. The potential V1 is also supplied to gates of the transistors 46, 49, and 52. The potential V0 is supplied to one of a source and a drain of each of the transistors 42, 48, 51, and 54. The other of the source and the drain of the transistor 40 and one of a source and a drain of each of the transistors 46, 41, and 52 are electrically connected to each other. The other of the source and the drain of the transistor 41 and the other of the source and the drain of the transistor 42 are electrically connected to each other. Gates of the transistors 41, 42, 51, and 54, the other of the source and the drain of each of the transistors 43, 44, and 45, and one of a source and a drain of the transistor 47 are electrically connected to each other. The other of the source and the drain of the transistor 47 and the other of the source and the drain of the transistor 48 are electrically connected to each other. The other of the source and the drain of the transistor 46 and one of a source and a drain of the transistor 49 are electrically connected to each other. The other of the source and the drain of the transistor 49 is electrically connected to a gate of the transistor 50. A signal CLK2 is input to a gate of the transistor 43. A signal RN is input to a gate of the transistor 44. A signal INRES is input to a gate of the transistor 45. A signal CLK1 is input to one of a source and a drain of each of the transistors 50 and 53. The other of the source and the drain of the transistor 52 is electrically connected to a gate of the transistor 53. The other of the source and the drain of each of the transistors 50 and 51 is electrically connected to a terminal SROUT. A potential output from the terminal SROUT is used as the signal RIN or LIN of another sequential circuit. The other of the source and the drain of each of the transistors 53 and 54 is electrically connected to a terminal GOUT.

For example, in the case where the transistors 40 to 54 are n-channel transistors, when the first driving method is selected, the signals LIN, RIN, CLK1, CLK2, and INRES are pulse signals, high-level potentials of these signals each correspond to the potential $VH_{TX}$, and low-level potentials of these signals each correspond to the potential $VL_{TX}$. The potentials $VH_{TX}$ and $VL_{TX}$ are used as the potentials V1 and V0, respectively. With such a structure, the potential $VL_{TX}$ or $VH_{TX}$ for controlling the operating state of the transistor 16 is supplied from the terminal GOUT to the wiring TX.

For example, in the case where the transistors 40 to 54 are n-channel transistors, when the second driving method is selected, the signals LIN, RIN, CLK1, CLK2, and INRES each have the fixed potential $VM_{TX}$. The potential $VM_{TX}$ is used as each of the potentials V1 and V0. With such a structure, the potential $VM_{TX}$ for controlling the operating state of the transistor 16 is supplied from the terminal GOUT to the wiring TX.

<Specific Structure Examples of Precharge Circuit and Switch Circuit>

Figure 10:
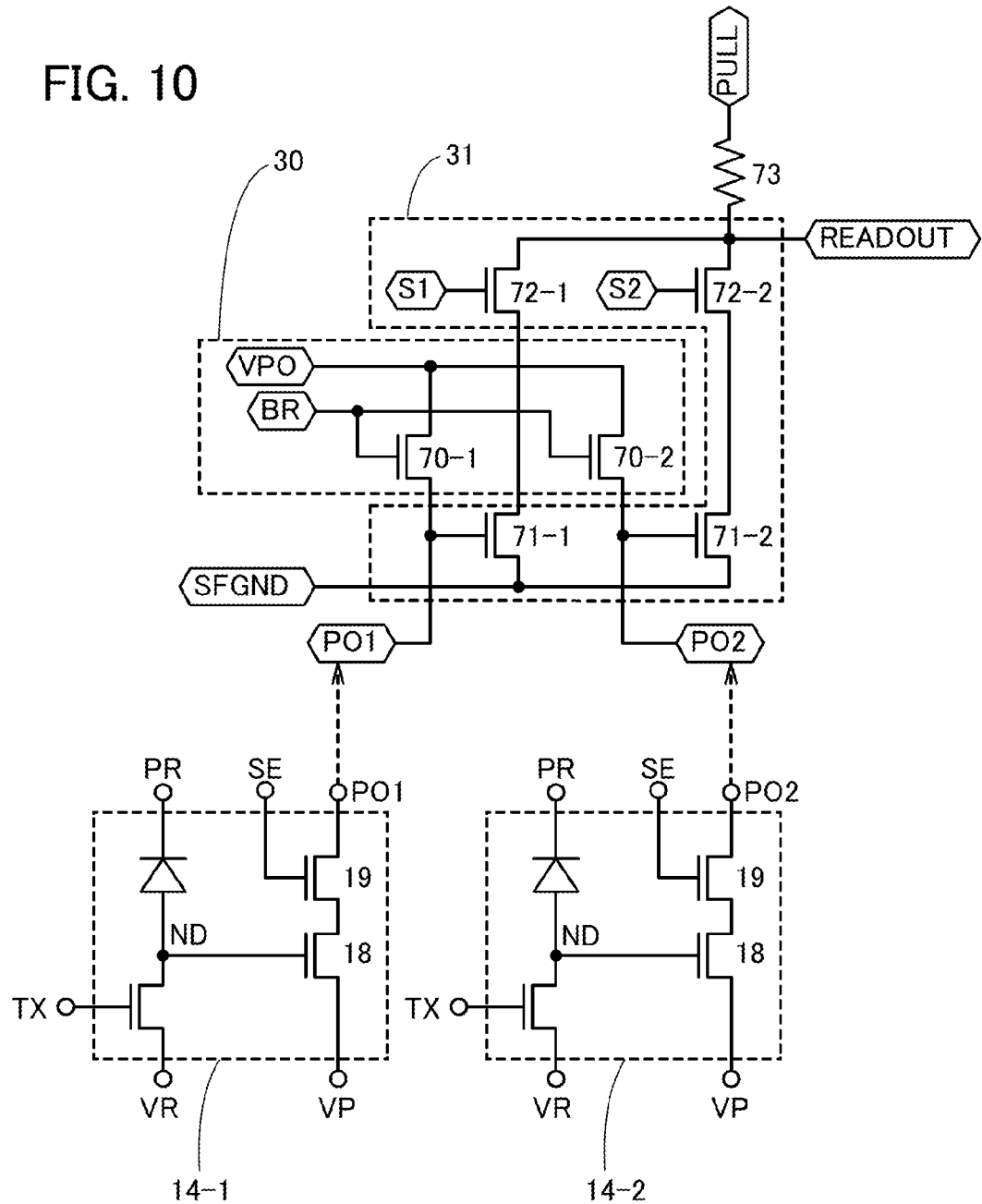
FIG. 10 illustrates structure examples of a precharge circuit and a switch circuit.

Next, FIG. 10 illustrates specific circuit structure examples of the precharge circuit 30 and the switch circuit 31 included in the driver 22. Note that in FIG. 10, the structures of the precharge circuit 30 and the switch circuit 31 that correspond to the wirings PO1 and PO2 are illustrated. To clarify connection between the wirings PO1 and PO2 and the pixels 14, FIG. 10 illustrates a pixel 14-1 connected to the wiring PO1 and a pixel 14-2 connected to the wiring PO2 together with the precharge circuit 30 and the switch circuit 31.

The precharge circuit 30 in FIG. 10 includes a transistor 70-1 that controls supply of a potential VPO to the wiring PO1 in response to a signal BR and a transistor 70-2 that controls supply of the potential VPO to the wiring PO2 in response to the signal BR.

The switch circuit 31 in FIG. 10 includes a transistor 71-1 whose source-drain resistance is determined by the potential of the wiring PO1 and a transistor 71-2 whose source-drain resistance is determined by the potential of the wiring PO2. A potential SFGND is supplied to one of a source and a drain of each of the transistors 71-1 and 71-2. The switch circuit 31 in FIG. 10 further includes a transistor 72-1 that controls electrical connection between an output terminal and the other of the source and the drain of the transistor 71-1 in response to a signal S1 and a transistor 72-2 that controls electrical connection between the output terminal and the other of the source and the drain of the transistor 71-2 in response to a signal S2.

A potential PULL is supplied to the output terminal through a resistor 73. The potential of the output terminal is output as a signal READOUT and supplied to the analog/digital converter 21 in FIG. 6.

Next, operation of the precharge circuit 30 and the switch circuit 31 in which all the transistors are n-channel transistors is described as an example.

First, before image information is read, the potentials of the wirings PO1 and PO2 are initialized while the transistors 19 are kept off. Specifically, in the precharge circuit 30, the potential of the signal BR is set high to turn on the transistors 70-1 and 70-2. Through the operation, the potential VPO is supplied to the wirings PO1 and PO2 through the transistors 70-1 and 70-2.

Next, the potential of the signal BR is set low to turn off the transistors 70-1 and 70-2. Then, in the pixels 14-1 and 14-2, the potentials of the wirings SE are sequentially set high to turn on the transistors 19. Through the operation, the potentials of the wirings PO1 and PO2 are determined by the source-drain resistance of the transistors 18. Note that the source-drain resistance of the transistor 18 is determined by the potential of the node ND and the intensity of light received in the light-receiving element 15 is reflected in the potential of the node ND; thus, the light intensity is indirectly reflected in the potentials of the wirings PO1 and PO2.

Next, in the pixels 14-1 and 14-2, the potentials of the wirings SE are sequentially set low to turn off the transistors 19. Then, the potential of the signal S1 is set high to turn on the transistor 72-1. The source-drain resistance of the transistor 71-1 is determined by the potential of the wiring PO1; thus, through the operation, the potential of the output terminal is determined by the potential of the wiring PO1, i.e., the intensity of light received in the light-receiving element 15 in the pixel 14-1. Then, after the potential of the signal S1 is set low, the potential of the signal S2 is set high to turn on the transistor 72-2. The source-drain resistance of the transistor 71-2 is determined by the potential of the wiring PO2; thus, through the operation, the potential of the output terminal is determined by the potential of the wiring PO2, i.e., the intensity of light received in the light-receiving element 15 in the pixel 14-2.

Note that although FIG. 10 illustrates the structures of the precharge circuit 30 and the switch circuit 31 that are constituted using the wirings PO1 and PO2, the precharge circuit 30 and the switch circuit 31 can be constituted using a larger number of wirings PO.

<Specific Structure Example of Semiconductor Display Device>

In a semiconductor display device according to one embodiment of the present invention, the solid-state imaging device 10 in FIG. 1A has a function of displaying images. Thus, the sensor circuit 11 in FIG. 1A is provided in a pixel portion for displaying images in the semiconductor display device, and the pixel portion includes a pixel for expressing gradation by using a display element and the pixel 14 for obtaining image information.

Figure 11A:
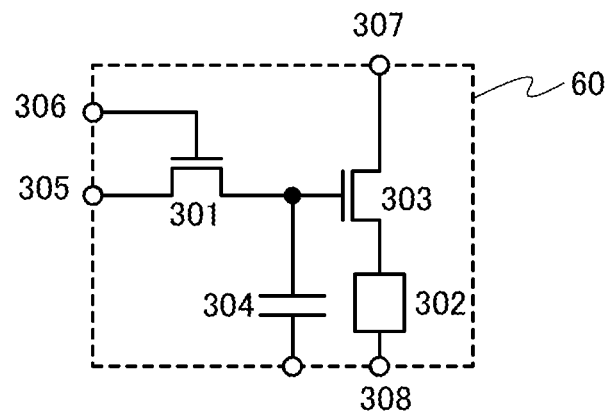
FIGS. 11A and 11B each illustrate a structure example of a semiconductor display device.

A specific structure of a pixel for expressing gradation by using a light-emitting element that is included in the semiconductor display device according to one embodiment of the present invention is described giving a light-emitting device as an example. FIG. 11A is an example of a circuit diagram of a pixel 60 included in the light-emitting device. The pixel 60 includes a transistor 301 that controls input of an image signal to the pixel 60, a light-emitting element 302, a transistor 303 that controls the value of current supplied to the light-emitting element 302 in response to an image signal, and a capacitor 304 for holding the potential of an image signal.

The potential of one of an anode and a cathode of the light-emitting element 302 is controlled in response to an image signal input to the pixel 60. A reference potential Vcom is applied to the other of the anode and the cathode of the light-emitting element 302. The luminance of the light-emitting element 302 is determined by a potential difference between the anode and the cathode. In each of the plurality of pixels 60 included in the pixel portion, the luminance of the light-emitting element 302 is adjusted in response to an image signal containing image information, so that an image is displayed on the pixel portion.

Next, connection of the transistor 301, the transistor 303, the capacitor 304, and the light-emitting element 302 that are included in the pixel 60 is described.

One of a source and a drain of the transistor 301 is connected to a wiring 305, and the other of the source and the drain of the transistor 301 is connected to a gate of the transistor 303. A gate of the transistor 301 is connected to a wiring 306. One of a source and a drain of the transistor 303 is connected to a wiring 307, and the other of the source and the drain of the transistor 303 is connected to the light-emitting element 302. Specifically, the other of the source and the drain of the transistor 303 is connected to one of the anode and the cathode of the light-emitting element 302. The other of the anode and the cathode of the light-emitting element 302 is connected to a wiring 308 to which the reference potential Vcom is applied.

Note that in FIG. 11A, the pixel 60 includes the capacitor 304. However, for example, in the case where gate capacitance generated between the gate and an active layer of the transistor 301 or gate parasitic capacitance is high, i.e., the case where the potential of an image signal can be sufficiently held by another capacitor, the capacitor 304 is not necessarily provided in the pixel 60.

Figure 11B:
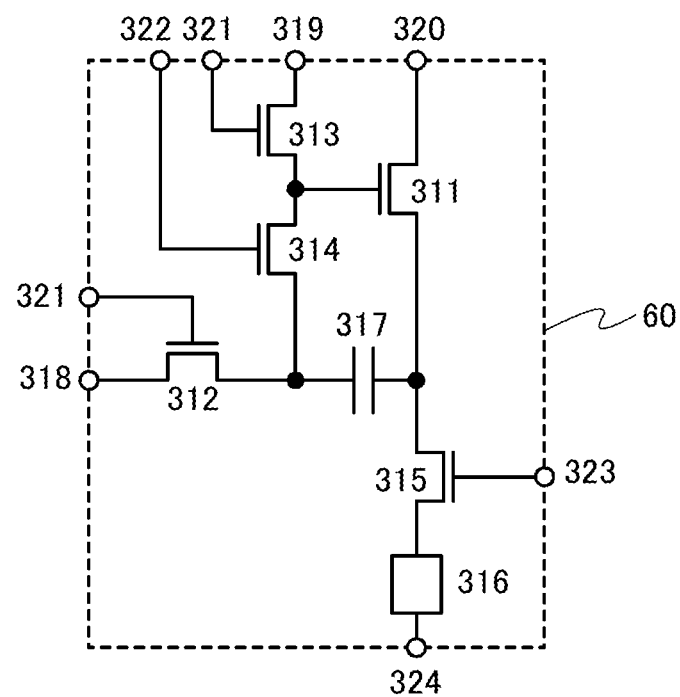

FIG. 11B is an example of a circuit diagram of the pixel 60. The pixel 60 includes transistors 311 to 315, a light-emitting element 316, and a capacitor 317.

The transistor 312 has a function of controlling connection between a wiring 318 and one of a pair of electrodes of the capacitor 317. The other of the pair of electrodes of the capacitor 317 is connected to one of a source and a drain of the transistor 311. The transistor 313 has a function of controlling connection between a wiring 319 and a gate of the transistor 311. The transistor 314 has a function of controlling connection between one of the pair of electrodes of the capacitor 317 and the gate of the transistor 311. The transistor 315 has a function of controlling connection between one of the source and the drain of the transistor 311 and one of an anode and a cathode of the light-emitting element 316.

In FIG. 11B, the other of the source and the drain of the transistor 311 is connected to a wiring 320.

The on or off state of the transistor 312 is determined by the potential of a wiring 321 connected to a gate of the transistor 312. The on or off state of the transistor 313 is determined by the potential of the wiring 321 connected to a gate of the transistor 313. The on or off state of the transistor 314 is determined by the potential of a wiring 322 connected to a gate of the transistor 314. The on or off state of the transistor 315 is determined by the potential of a wiring 323 connected to a gate of the transistor 315. The other of the anode and the cathode of the light-emitting element 316 is connected to a wiring 324 to which the reference potential Vcom is applied.

Note that in FIGS. 11A and 11B, the pixel 60 may further include another circuit element such as a transistor, a diode, a resistor, a capacitor, or an inductor as needed.

Examples of the light-emitting elements 302 and 316 include an element whose luminance is controlled by current or voltage, such as a light-emitting diode (LED) or an organic light-emitting diode (OLED). For example, an OLED includes at least an EL layer, an anode, and a cathode. The EL layer is formed using a single layer or a plurality of layers provided between the anode and the cathode, at least one of which is a light-emitting layer containing a light-emitting substance. From the EL layer, electroluminescence is obtained by current supplied when a potential difference between the cathode and the anode is higher than or equal to the threshold voltage of each of the light-emitting elements 302 and 316. Electroluminescence includes luminescence (fluorescence) at the time of returning from a singlet-excited state to a ground state and luminescence (phosphorescence) at the time of returning from a triplet-excited state to a ground state.

In FIGS. 11A and 11B, the transistors each have the gate on at least one side of a semiconductor film; alternatively, the transistors may each have a pair of gates with a semiconductor film positioned therebetween. When one of the pair of gates is regarded as a back gate, potentials at the same level may be applied to a normal gate and the back gate, or a fixed potential such as a ground potential may be applied only to the back gate. By controlling the level of the potential applied to the back gate, the threshold voltage of the transistor can be controlled. By providing the back gate, a channel formation region is enlarged and drain current can be increased. Furthermore, the back gate facilitates formation of a depletion layer in the semiconductor film, which results in lower subthreshold swing.

The transistors in FIGS. 11A and 11B are all n-channel transistors. When the transistors in the pixel 60 have the same polarity, it is possible to simplify steps of forming the transistors.

In the case where the transistor 303 operates in a saturation region, its channel length or channel width is preferably larger than those of transistors other than the transistor 303 in the pixel 60. An increase in channel length reduces the kink effect and flattens the value of drain current with respect to source-drain voltage in the saturation region. Alternatively, the increase in channel width makes a large amount of current flow through the transistor 303 even in the saturation region.

In FIGS. 11A and 11B, the transistors in the pixel 60 each have a single-gate structure including one gate and one channel formation region in one semiconductor film; however, the present invention is not limited to this structure. Any or all of the transistors in the pixel 60 may have a multi-gate structure including a plurality of gates electrically connected to each other and a plurality of channel formation regions in one semiconductor film.

Although FIGS. 11A and 11B illustrate the structure example of the light-emitting device, the semiconductor display device according to one embodiment of the present invention includes a liquid crystal display device including a liquid crystal element, which is a kind of display element, in a pixel.

Figure 12:
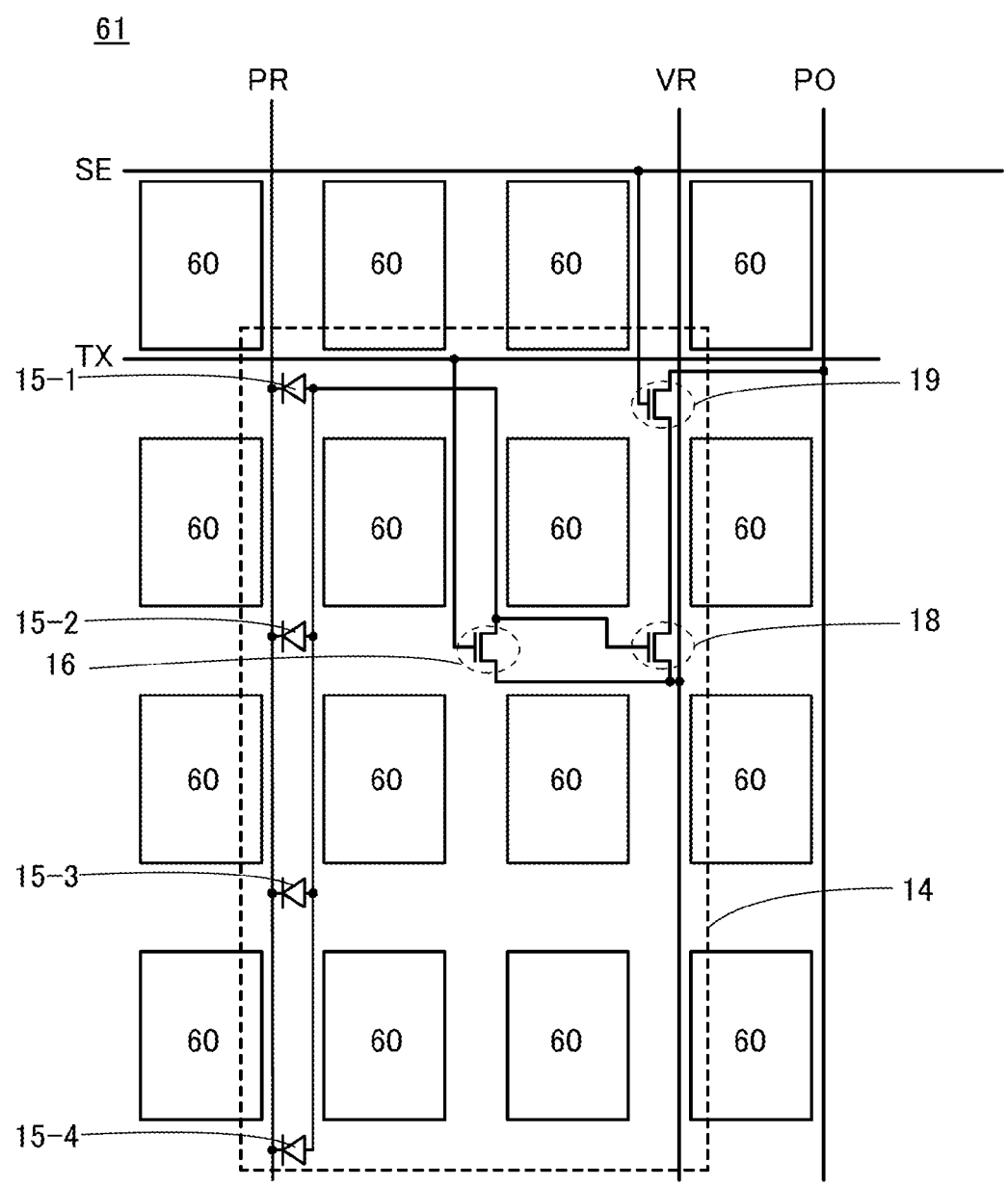
FIG. 12 illustrates a structure example of a pixel portion of the semiconductor display device.

Next, FIG. 12 illustrates a structure example of part of a pixel portion 61 included in a semiconductor display device. The pixel portion 61 in FIG. 12 includes the plurality of pixels 60 arranged in matrix and the pixel 14 for obtaining image information that overlaps the pixels 60.

The transistors 16, 18, and 19 and light-receiving elements 15-1 to 15-4 that are included in the pixel 14 are provided between the pixels 60. In FIG. 12, anodes of the light-receiving elements 15-1 to 15-4 are electrically connected to each other, and cathodes of the light-receiving elements 15-1 to 15-4 are electrically connected to each other. Note that the pixel 14 may include one light-receiving element 15 as illustrated in FIGS. 1A and 1B or may include the plurality of light-receiving elements 15 (the number of the light-receiving elements 15 is not limited four). In the case where the pixel 14 includes the plurality of light-receiving elements 15, anodes of the plurality of light-receiving elements 15 are electrically connected to each other, and cathodes of the plurality of light-receiving elements 15 are electrically connected to each other.

<Cross-Sectional Structure of Semiconductor Display Device>

Figure 13:
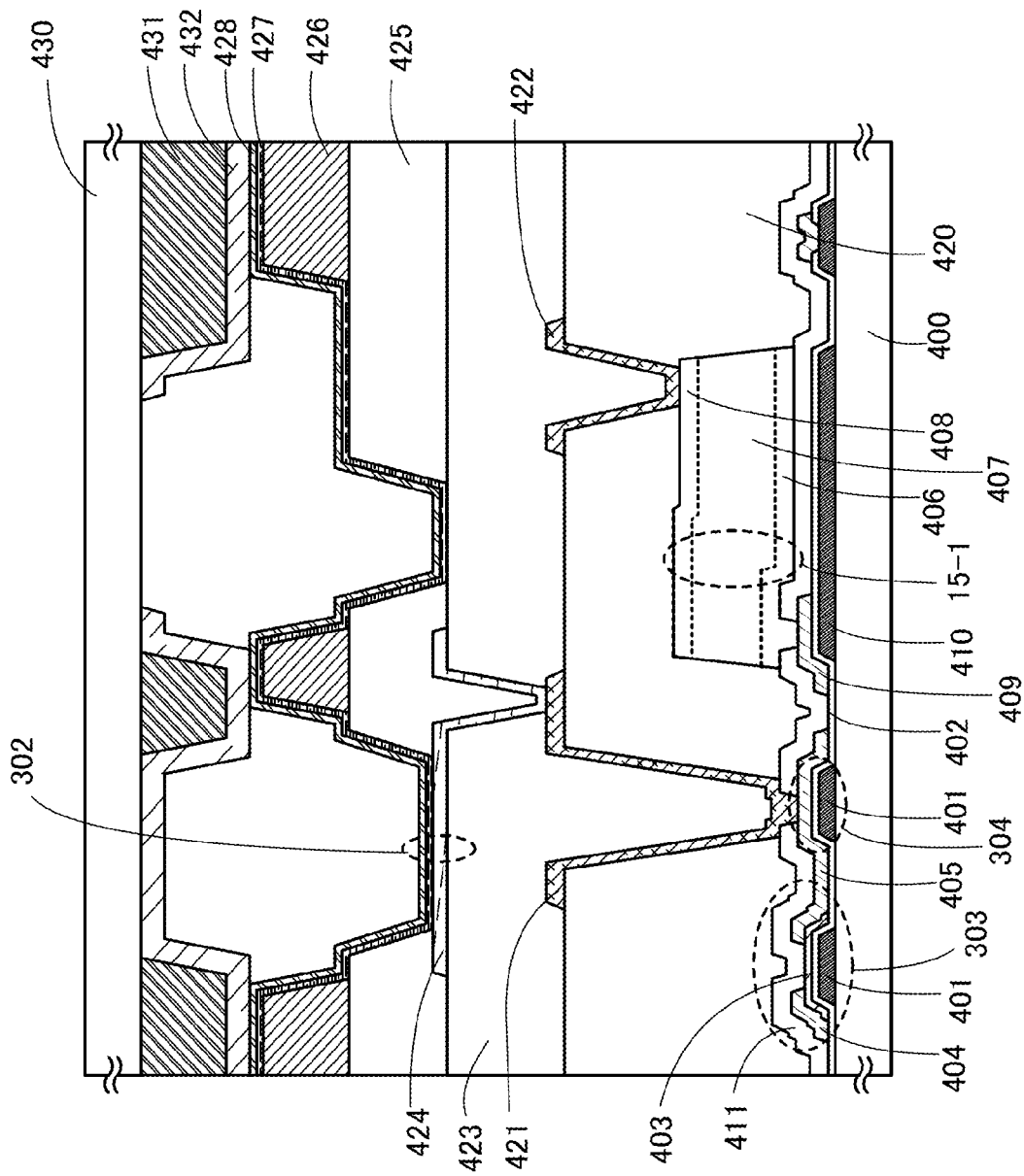
FIG. 13 is a cross-sectional view of the semiconductor display device.

FIG. 13 illustrates the cross-sectional structure of a pixel portion in a light-emitting device according to one embodiment of the present invention. Note that FIG. 13 illustrates the cross-sectional structures of the light-receiving element 15-1 in FIG. 12 and the transistor 303, the capacitor 304, and the light-emitting element 302 in FIG. 11A.

Specifically, the light-emitting device in FIG. 13 includes the transistor 303, the capacitor 304, and the light-receiving element 15-1 over a substrate 400. The transistor 303 includes a conductive film 401 that functions as a gate; an insulating film 402 over the conductive film 401; a semiconductor film 403 that overlaps the conductive film 401 with the insulating film 402 positioned therebetween; and conductive films 404 and 405 that function as a source and a drain electrically connected to the semiconductor film 403.

The capacitor 304 includes the conductive film 401 that functions as an electrode; the insulating film 402 over the conductive film 401; and the conductive film 405 that overlaps the conductive film 401 with the insulating film 402 positioned therebetween and functions as an electrode.

The insulating film 402 may be a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Note that in this specification, oxynitride contains more oxygen than nitrogen, and nitride oxide contains more nitrogen than oxygen.

An insulating film 411 is provided over the semiconductor film 403 and the conductive films 404 and 405. In the case where an oxide semiconductor is used for the semiconductor film 403, it is preferable to use a material that can supply oxygen to the semiconductor film 403 for the insulating film 411. By using the material for the insulating film 411, oxygen contained in the insulating film 411 can be moved to the semiconductor film 403, and the amount of oxygen vacancy in the semiconductor film 403 can be reduced. Oxygen contained in the insulating film 411 can be moved to the semiconductor film 403 efficiently by heat treatment performed after the insulating film 411 is formed.

The light-receiving element 15-1 includes a p-type semiconductor film 406, an i-type semiconductor film 407, and an n-type semiconductor film 408 that are sequentially stacked. A conductive film 409 is connected to the p-type semiconductor film 406 that functions as the anode of the light-receiving element 15-1. A conductive film 410 that has a function of reflecting light passing through the light-receiving element 15-1 is provided between the substrate 400 and the light-receiving element 15-1.

Specifically, the insulating film 402 is provided over the conductive film 410; the conductive film 409 is provided over the insulating film 402; the insulating film 411 is provided over the conductive film 409; and the semiconductor film 406 of the light-receiving element 15-1 is provided over the insulating film 411. An opening is formed in the insulating film 411, and the conductive film 409 is connected to the semiconductor film 406 through the opening.

An insulating film 420 is provided over the transistor 303, the capacitor 304, and the light-receiving element 15-1, and conductive films 421 and 422 are provided over the insulating film 420. The conductive film 421 is connected to the conductive film 405 through an opening formed in the insulating films 411 and 420. In addition, the conductive film 422 is connected to the semiconductor film 408 of the light-receiving element 15-1 through an opening formed in the insulating film 420.

An insulating film 423 is provided over the insulating film 420 and the conductive films 421 and 422, and a conductive film 424 is provided over the insulating film 423. The conductive film 424 is connected to the conductive film 421 through an opening formed in the insulating film 423.

An insulating film 425 is provided over the insulating film 423 and the conductive film 424. The insulating film 425 has an opening that overlaps the conductive film 424 and an opening that overlaps the light-receiving element 15-1. Over the insulating film 425, an insulating film 426 is provided in a position that is different from the positions of the openings of the insulating film 425. An EL layer 427 and a conductive film 428 are sequentially stacked over the insulating films 425 and 426. A portion in which the conductive films 424 and 428 overlap each other with the EL layer 427 positioned therebetween functions as the light-emitting element 302. One of the conductive films 424 and 428 functions as an anode, and the other of the conductive films 424 and 428 functions as a cathode.

The light-emitting device includes a substrate 430 that faces the substrate 400 with the light-emitting element 302 positioned therebetween. A blocking film 431 that has a function of blocking light is provided over the substrate 430, i.e., over a surface of the substrate 430 that is close to the light-emitting element 302. The blocking film 431 has an opening that overlaps the light-emitting element 302 and an opening that overlaps the light-receiving element 15-1. In the opening that overlaps the light-emitting element 302, a coloring layer 432 that transmits visible light in a specific wavelength range is provided over the substrate 430. Note that to increase the intensity of light that passes through the substrate 430 and enters the light-receiving element 15-1, it is preferable that the coloring layer 432 do not overlap the light-receiving element 15-1.

<Transistor in Solid-State Imaging Device>

Figure 14A:
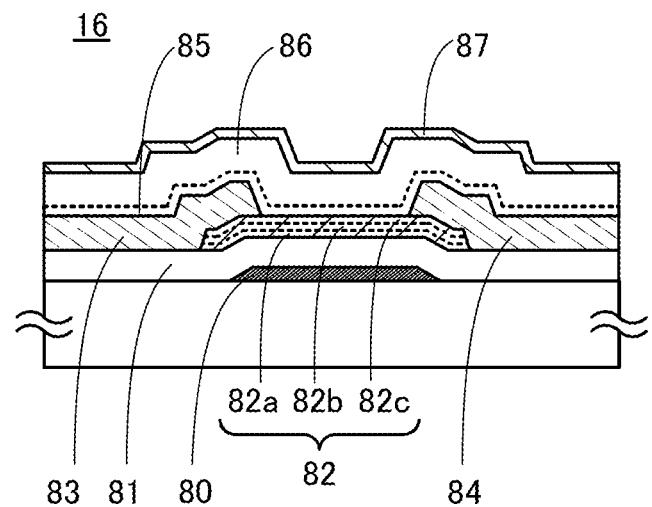
FIGS. 14A and 14B are cross-sectional views of transistors.

The off-state current of the transistor 16 included in the solid-state imaging device 10 in FIGS. 1A and 1B is preferably lower than the off-state current of another transistor included in the pixel 14. Thus, the transistor 16 preferably includes the channel formation region in the oxide semiconductor film. FIG. 14A illustrates a structure example of the transistor 16 that includes the channel formation region in the oxide semiconductor film.

The transistor 16 in FIG. 14A includes a conductive film 80 that functions as a gate; an insulating film 81 over the conductive film 80; an oxide semiconductor film 82 that overlaps the conductive film 80 with the insulating film 81 positioned therebetween; and conductive films 83 and 84 that function as a source and a drain connected to the oxide semiconductor film 82. The transistor 16 in FIG. 14A further includes insulating films 85 to 87 sequentially stacked over the oxide semiconductor film 82 and the conductive films 83 and 84.

Note that in FIG. 14A, the insulating films 85 to 87 are sequentially stacked over the oxide semiconductor film 82 and the conductive films 83 and 84; however, the number of insulating films provided over the oxide semiconductor film 82 and the conductive films 83 and 84 may be one or three or more.

The insulating film 86 preferably contains oxygen at a proportion higher than or equal to the stoichiometric composition and has a function of supplying part of oxygen to the oxide semiconductor film 82 by heating. In addition, the insulating film 86 preferably has few defects, typically, spin density at g=2.001 due to a dangling bond of silicon is preferably lower than or equal to $1\times10^{18}$ spins/cm$^3$ when measured by ESR. Note that in the case where the oxide semiconductor film 82 is damaged at the time of formation of the insulating film 86 when the insulating film 86 is directly formed on the oxide semiconductor film 82, the insulating film 85 is preferably provided between the oxide semiconductor film 82 and the insulating film 86, as illustrated in FIG. 14A. The insulating film 85 preferably causes little damage to the oxide semiconductor film 82 when the insulating film 85 is formed compared with the case of the insulating film 86 and has a function of passing oxygen. If damage to the oxide semiconductor film 82 can be reduced and the insulating film 86 can be formed directly on the oxide semiconductor film 82, the insulating film 85 is not necessarily provided.

The insulating film 85 preferably has a few defects, typically, spin density at g=2.001 due to a dangling bond of silicon is lower than or equal to $3 \times 10^{17}$ spins/cm$^3$ when measured by ESR. This is because if the density of defects in the insulating film 85 is high, oxygen is bonded to the defects and the amount of oxygen that passes through the insulating film 85 is decreased.

Furthermore, an interface between the insulating film 85 and the oxide semiconductor film 82 preferably has a few defects, typically, spin density at g=1.93 due to oxygen vacancies in an oxide semiconductor used for the oxide semiconductor film 82 is lower than or equal to $1 \times 10^{17}$ spins/cm$^3$, preferably lower than or equal to the measurement limit when measured by ESR where a magnetic field is applied parallel to a film surface.

The insulating film 87 preferably has an effect of blocking diffusion of oxygen, hydrogen, and water. Alternatively, the insulating film 87 preferably has an effect of blocking diffusion of hydrogen and water.

As an insulating film has higher density and becomes denser or has a fewer dangling bonds and becomes more chemically stable, the insulating film has a higher blocking effect. An insulating film that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has an effect of blocking diffusion of hydrogen and water can be formed using, for example, silicon nitride or silicon nitride oxide.

In the case where the insulating film 87 has an effect of blocking diffusion of water, hydrogen, and the like, impurities such as water and hydrogen that exist in a resin in a panel or exist outside the panel can be prevented from entering the oxide semiconductor film 82. Since an oxide semiconductor is used for the oxide semiconductor film 82, part of water or hydrogen entering the oxide semiconductor is one of factors that generate electron donors (donors). Thus, the use of the insulating film 87 having the blocking effect can prevent a shift in threshold voltage of the transistor 16 due to generation of donors.

In addition, in the case where an oxide semiconductor is used for the oxide semiconductor film 82, when the insulating film 87 has an effect of blocking diffusion of oxygen, diffusion of oxygen from the oxide semiconductor into the outside can be prevented. Accordingly, oxygen vacancies in the oxide semiconductor that serve as donors are reduced, so that a shift in threshold voltage of the transistor 16 due to generation of donors can be prevented.

FIG. 14A illustrates an example in which the oxide semiconductor film 82 is formed using a stack of three oxide semiconductor films. Specifically, in the transistor 16 in FIG. 14A, the oxide semiconductor film 82 is formed by stacking oxide semiconductor films 82a to 82c sequentially from the insulating film 81 side. The oxide semiconductor film 82 of the transistor 16 is not limited to a stack of a plurality of oxide semiconductor films, but may be a single oxide semiconductor film.

Each of the oxide semiconductor films 82a and 82c is an oxide film that contains at least one of metal elements contained in the oxide semiconductor film 82b and in which energy at the bottom of the conduction band is closer to the vacuum level than that in the oxide semiconductor film 82b by higher than or equal to 0.05 eV, 0.07 eV, 0.1 eV, or 0.15 eV and lower than or equal to 2 eV, 1 eV, 0.5 eV, or 0.4 eV. The oxide semiconductor film 82b preferably contains at least indium because carrier mobility is increased.

Figure 14B:
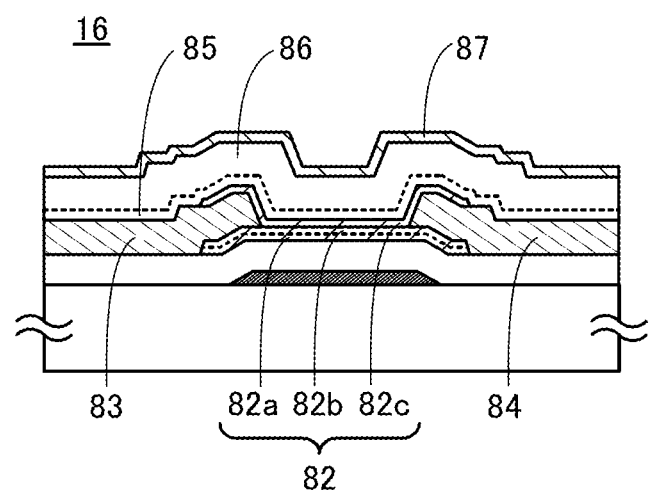

As illustrated in FIG. 14B, over the conductive films 83 and 84, the oxide semiconductor film 82c of the transistor 16 may overlap the insulating film 85.

There are few carrier generation sources in a highly purified oxide semiconductor (purified oxide semiconductor) obtained by reduction of impurities such as moisture and hydrogen and reduction of oxygen vacancies; thus, the highly purified oxide semiconductor can be an intrinsic (i-type) semiconductor or a substantially intrinsic semiconductor. For this reason, a transistor including a channel formation region in a highly purified oxide semiconductor film has extremely low off-state current and high reliability. A transistor including the oxide semiconductor film in which a channel formation region is formed is likely to have positive threshold voltage (normally-off characteristics).

Specifically, various experiments can prove low off-state current of a transistor including a channel formation region in a highly-purified oxide semiconductor film. For example, even when an element has a channel width of $1 \times 10^6$ μm and a channel length of 10 μm, off-state current can be lower than or equal to the measurement limit of a semiconductor parameter analyzer, i.e., lower than or equal to $1 \times 10^{-13}$ A, at a voltage (drain voltage) between a source electrode and a drain electrode of 1 to 10 V. In that case, it can be seen that off-state current standardized on the channel width of the transistor is lower than or equal to 100 zA/μm. In addition, a capacitor and a transistor were connected to each other and off-state current was measured using a circuit in which charge flowing into or from the capacitor is controlled by the transistor. In the measurement, a highly-purified oxide semiconductor film was used in the channel formation region of the transistor, and the off-state current of the transistor was measured from a change in the amount of charge of the capacitor per unit hour. As a result, it can be seen that, in the case where the voltage between the source electrode and the drain electrode of the transistor is 3 V, a lower off-state current of several tens of yoctoamperes per micrometer is obtained. Accordingly, the transistor including the highly-purified oxide semiconductor film in the channel formation region has much lower off-state current than a crystalline silicon transistor.

In the case where an oxide semiconductor film is used as the semiconductor film, an oxide semiconductor preferably contains at least indium (In) or zinc (Zn). As a stabilizer for reducing variations in electrical characteristics of a transistor including the oxide semiconductor film, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn-based oxide, an In—Sn—Zn-based oxide, or the like has an advantage of high mass productivity because a transistor with favorable electrical characteristics can be formed by sputtering or a wet process. Furthermore, unlike silicon carbide, gallium nitride, or gallium oxide, with the use of the In—Ga—Zn-based oxide, a transistor with favorable electrical characteristics can be formed over a glass substrate. Furthermore, a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, indium oxide, gallium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Ce—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used as an oxide semiconductor.

Note that, for example, an In—Ga—Zn-based oxide means an oxide containing In, Ga, and Zn, and there is no limitation on the ratio of In, Ga, and Zn. In addition, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Furthermore, the In—Ga—Zn-based oxide has high mobility.

For example, with an In—Sn—Zn-based oxide, high mobility can be comparatively easily obtained. However, even with an In—Ga—Zn-based oxide, mobility can be increased by lowering defect density in a bulk.

The structure of the oxide semiconductor film is described below.

An oxide semiconductor film is roughly classified into a single-crystal oxide semiconductor film and a non-single-crystal oxide semiconductor film. The non-single-crystal oxide semiconductor film means any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region, and the whole of the film is amorphous.

The microcrystalline oxide semiconductor film includes a microcrystal (also referred to as nanocrystal) of greater than or equal to 1 nm and less than 10 nm, for example. Thus, the microcrystalline oxide semiconductor film has higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit into a cube whose one side is less than 100 nm. Thus, there is a case where a crystal part included in the CAAC-OS film fits into a cube whose one side is less than 10 nm, less than 5 nm, or less than 3 nm. The density of defect states of the CAAC-OS film is lower than that of the microcrystalline oxide semiconductor film. In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, the term "parallel" indicates that an angle formed between two straight lines is $-10$ to $10°$, and accordingly includes the case where the angle is $-5$ to $5°$. In addition, the term "perpendicular" indicates that an angle formed between two straight lines is 80 to $100°$, and accordingly includes the case where the angle is 85 to $95°$.

On the other hand, according to the TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

From the results of the cross-sectional TEM image and the planar TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around $31°$. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around $56°$. This peak is derived from the (110) plane of the $InGaZnO_4$ crystal. Here, analysis ($\phi$ scan) is performed under conditions where the sample is rotated around a normal vector of a sample surface as an axis ($\theta$ axis) with $2\theta$ fixed at around $56°$. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\theta$ scan is performed with $2\theta$ fixed at around $56°$.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Furthermore, the crystallinity in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Furthermore, when an impurity is added to the CAAC-OS film, the crystallinity in a region to which the impurity is added is changed, and the crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ not appear at around 36°.

In a transistor including the CAAC-OS film, changes in electrical characteristics of the transistor due to irradiation with visible light or ultraviolet light are small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For the deposition of the CAAC-OS film, the following conditions are preferably employed.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle occurs after the sputtered particle reaches the substrate. Specifically, the substrate heating temperature during the deposition is 100 to 740° C., preferably 200 to 500° C. By increasing the substrate heating temperature during the deposition, when the flat-plate-like or pellet-like sputtered particle reaches the substrate, migration occurs on the substrate, so that a flat plane of the sputtered particle is attached to the substrate.

Furthermore, it is preferable to reduce plasma damage during the deposition by increasing the proportion of oxygen in the deposition gas and optimizing power. The proportion of oxygen in the deposition gas is 30 vol % or higher, preferably 100 vol %.

As an example of the target, an In—Ga—Zn-based oxide target is described below.

A polycrystalline In—Ga—Zn-based oxide target is made by mixing $InO_X$ powder, $GaO_Y$ powder, and $ZnO_Z$ powder in a predetermined mole ratio, applying pressure, and performing heat treatment at 1000 to 1500° C. Note that X, Y, and Z are each a given positive number. Here, the predetermined mole ratio of the $InO_X$ powder, the $GaO_Y$ powder, and the $ZnO_Z$ powder is, for example, 2:2:1, 8:4:3, 3:1:1, 1:1:1, 4:2:3, or 3:1:2. The kinds of powder and the mole ratio for mixing powder may be changed as appropriate depending on a target to be formed.

Alkali metal is not an element included in an oxide semiconductor and thus is an impurity. Alkaline earth metal is also an impurity in the case where alkaline earth metal is not included in an oxide semiconductor. Alkali metal, in particular, Na becomes $Na^+$ when an insulating film that is in contact with an oxide semiconductor film is an oxide and Na diffuses into the insulating film. In addition, in the oxide semiconductor film, Na cuts or enters a bond between metal and oxygen that are included in an oxide semiconductor. As a result, for example, degradation in transistor electrical characteristics, such as a normally on state of the transistor due to a shift in the threshold voltage in a negative direction, or a decrease in mobility, occurs. Specifically, the measurement value of a Na concentration by secondary ion mass spectrometry is preferably $5\times10^{16}/cm^3$ or less, more preferably $1\times10^{16}/cm^3$ or less, still more preferably $1\times10^{15}/cm^3$ or less. Similarly, the measurement value of a Li concentration is preferably $5\times10^{15}/cm^3$ or less, more preferably $1\times10^{15}/cm^3$ or less. Similarly, the measurement value of a K concentration is preferably $5\times10^{15}/cm^3$ or less, more preferably $1\times10^{15}/cm^3$ or less.

In the case where a metal oxide containing indium is used, silicon or carbon having higher bond energy with oxygen than indium might cut the bond between indium and oxygen, so that an oxygen vacancy is formed. Accordingly, when silicon or carbon is contained in the oxide semiconductor film, the transistor electrical characteristics are likely to be degraded as in the case of alkali metal or alkaline earth metal. Thus, the concentration of silicon and carbon in the oxide semiconductor film is preferably low. Specifically, the measurement value of a C concentration or the measurement value of a Si concentration by secondary ion mass spectrometry is preferably $1\times10^{18}/cm^3$ or less. In that case, the degradation in transistor electrical characteristics can be prevented, so that the reliability of the semiconductor device can be increased.

Metal in the source electrode and the drain electrode extracts oxygen from the oxide semiconductor film depending on a conductive material used for the source electrode and the drain electrode. In that case, a region in the oxide semiconductor film that is in contact with the source electrode and the drain electrode has n-type conductivity due to generation of oxygen vacancies.

Since the region having n-type conductivity functions as a source region or a drain region, contact resistance between the oxide semiconductor film and the source electrode and the drain electrode can be lowered. Thus, by forming the region having n-type conductivity, the mobility and on-state current of the transistor can be increased, so that a semiconductor device including the transistor can operate at high speed.

Note that metal in the source electrode and the drain electrode might extract oxygen when the source electrode and the drain electrode are formed by sputtering or the like or might extract oxygen by heat treatment performed after the source electrode and the drain electrode are formed.

Furthermore, the region having n-type conductivity is easily formed by using a conductive material that is easily bonded to oxygen for the source electrode and the drain electrode. The conductive material can be, for example, Al, Cr, Cu, Ta, Ti, Mo, or W.

The oxide semiconductor film is not limited to a single-layer metal oxide film and may have a layered structure of a plurality of metal oxide films. In a semiconductor film in which first to third metal oxide films are stacked sequentially, for example, each of the first and third metal oxide films is an oxide film that contains at least one of metal elements contained in the second metal oxide film and in which energy at the bottom of the conduction band is closer to the vacuum level than that in the second metal oxide film by higher than or equal to 0.05 eV, 0.07 eV, 0.1 eV, or 0.15 eV and lower than or equal to 2 eV, 1 eV, 0.5 eV, or 0.4 eV. The second metal oxide film preferably contains at least indium because carrier mobility is increased.

In the case where the transistor has the above semiconductor film, when an electric field is applied to the semiconductor film by application of voltage to a gate electrode, a channel region is formed in the second metal oxide film whose energy at the bottom of the conduction band is low in the semiconductor film. In other words, the third metal oxide film is provided between the second metal oxide film and the gate insulating film, so that a channel region can be formed in the second metal oxide film spaced from the gate insulating film.

Since the third metal oxide film contains at least one of the metal elements contained in the second metal oxide film, interface scattering hardly occurs at an interface between the second metal oxide film and the third metal oxide film. Thus, carriers are not easily inhibited from moving at the interface, which results in an increase in field-effect mobility of the transistor.

When an interface state is formed at an interface between the second metal oxide film and the first metal oxide film, a channel region is also formed in a region close to the interface; thus, the threshold voltage of the transistor varies. However, since the first metal oxide film contains at least one of the metal elements contained in the second metal oxide film, an interface state is hardly formed at the interface between the second metal oxide film and the first metal oxide film. As a result, such a structure can reduce variations in transistor electrical characteristics (e.g., threshold voltage).

The plurality of oxide semiconductor films are preferably stacked so that impurities between the metal oxide films do not form an interface state that inhibits carriers from moving at an interface of each film. If impurities exist between the plurality of stacked metal oxide films, the continuity of energy at the bottom of the conduction band between the metal oxide films is lost, and carriers are trapped or lost due to recombination around the interface. A continuous bond (especially, a bond having a U-shaped and well-shaped structure where energy at the bottom of the conduction band is continuously changed between the films) is more likely to be formed in the plurality of metal oxide films containing at least one metal element (main component) in which impurities between the films are reduced than in the plurality of metal oxide films that contain at least one metal element (main component) and are simply stacked.

In order to form such a continuous bond, it is necessary to form films continuously without being exposed to the atmosphere with the use of a multi-chamber deposition apparatus (sputtering apparatus) including a load lock chamber. Each chamber of the sputtering apparatus is preferably evacuated to a high vacuum ($5\times10^{-7}$ to $1\times10^{-4}$ Pa) by an adsorption vacuum pump such as a cryopump so that water and the like, which are impurities for an oxide semiconductor, are removed as much as possible. Alternatively, a turbo molecular pump and a cold trap are preferably used in combination to prevent backflow of gas into the chamber through an evacuation system.

To obtain a highly-purified intrinsic oxide semiconductor, not only high vacuum evacuation of the chambers but also high purification of a sputtering gas is important. An oxygen gas or an argon gas used as the gas is highly purified to have a dew point of −40° C. or lower, preferably −80° C. or lower, more preferably −100° C. or lower, so that entry of moisture or the like into the oxide semiconductor film can be prevented as much as possible. Specifically, when the second metal oxide film is an In-M-Zn oxide film (M is Ga, Y, Zr, La, Ce, or Nd) and a target with an atomic ratio of metal elements of In:M:Zn=$x_1$:$y_1$:$z_1$ is used to form the second metal oxide film, $x_1/y_1$ is preferably 1/3 to 6, more preferably 1 to 6, and $z_1/y_1$ is preferably 1/3 to 6, more preferably 1 to 6. Note that when $z_1/y_1$ is 1 to 6, a CAAC-OS film is likely to be formed as the second metal oxide film. Typical examples of the atomic ratio of the metal elements of the target are In:M:Zn=1:1:1 and In:M:Zn=3:1:2.

Specifically, when first and third metal oxide films are each an In-M-Zn oxide film and a target with an atomic ratio of metal elements of In:M:Zn=$x_2$:$y_2$:$z_2$ is used to form the first and third metal oxide films, $x_2/y_2 < x_1/y_1$ is satisfied and $z_2/y_2$ is preferably 1/3 to 6, more preferably 1 to 6. Note that when $z_2/y_2$ is 1 to 6, CAAC-OS films are likely to be formed as the first and third metal oxide films. Typical examples of the atomic ratio of the metal elements of the target are In:M:Zn=1:3:2, In:M:Zn=1:3:4, In:M:Zn=1:3:6, and In:M:Zn=1:3:8.

The first and third metal oxide films each have a thickness of 3 to 100 nm, preferably 3 to 50 nm. The second metal oxide film has a thickness of 3 to 200 nm, preferably 3 to 100 nm, and more preferably 3 to 50 nm.

The three oxide semiconductor films (first to third metal oxide films) can be either amorphous or crystalline. Note that the second metal oxide film in which a channel region is formed is preferably crystalline because the transistor can have stable electrical characteristics.

Note that a channel formation region means a region of a semiconductor film of a transistor that overlaps with a gate electrode and is between a source electrode and a drain electrode. Furthermore, a channel region means a region through which current mainly flows in the channel formation region.

For example, in the case where an In—Ga—Zn-based oxide film formed by sputtering is used as each of the first and third metal oxide films, a target of an In—Ga—Zn-based oxide (In:Ga:Zn=1:3:2 [atomic ratio]) can be used for deposition of the first and third metal oxide films. The deposition conditions can be, for example, as follows: an argon gas (flow rate: 30 sccm) and an oxygen gas (flow rate: 15 sccm) are used as a deposition gas; pressure is 0.4 Pa; substrate temperature is 200° C.; and DC power is 0.5 kW.

In the case where the second metal oxide film is a CAAC-OS film, a target containing a polycrystalline In—Ga—Zn-based oxide (In:Ga:Zn=1:1:1 [atomic ratio]) is preferably used for the deposition. The deposition conditions can be, for example, as follows: an argon gas (flow rate: 30 sccm) and an oxygen gas (flow rate: 15 sccm) are used as a deposition gas; pressure is 0.4 Pa; substrate temperature is 300° C.; and DC power is 0.5 kW.

Note that the transistor may have a structure where the end portion of the semiconductor film is steep or a structure where the end portion of the semiconductor film is rounded.

Also in the case where a semiconductor film including stacked metal oxide films is used in the transistor, regions that are in contact with the source electrode and the drain electrode may have n-type conductivity. With such a structure, the mobility and on-state current of the transistor can be increased, so that a semiconductor device including the transistor can operate at high speed. Furthermore, in the case where the semiconductor film including the stacked metal oxide films is used in the transistor, the regions having n-type conductivity preferably extend to the second metal oxide film serving as a channel region in order that the mobility and on-state current of the transistor can be further increased and the semiconductor device can operate at higher speed.

<Electronic Device>

A solid-state imaging device can be formed together with a display element in a pixel portion of a semiconductor display device by a general CMOS process. Thus, by using an optical solid-state imaging device, it is possible to obtain a thin lightweight semiconductor display device that functions as a position input device. Accordingly, the optical solid-state imaging device is suitable for a portable electronic device. In addition, the optical solid-state imaging device has higher resistance to stress and is less likely to have low reliability when attached to a flexible semiconductor display device than a capacitive or resistive position input device (touch panel) whose components are partly or entirely independent from the semiconductor display device. Consequently, the optical solid-state imaging device is more suitable for the position input device attached to the flexible semiconductor display device than the touch panel.

A solid-state imaging device or semiconductor display device according to one embodiment of the present invention can be used for display devices, laptops, or image reproducing devices provided with recording media (typically, devices that reproduce the content of recording media such as digital versatile discs (DVD) and have displays for displaying the reproduced images). Furthermore, as electronic devices that can include the solid-state imaging device or semiconductor display device according to one embodiment of the present invention, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 16A to 16F illustrate specific examples of these electronic devices.

Figure 16A:
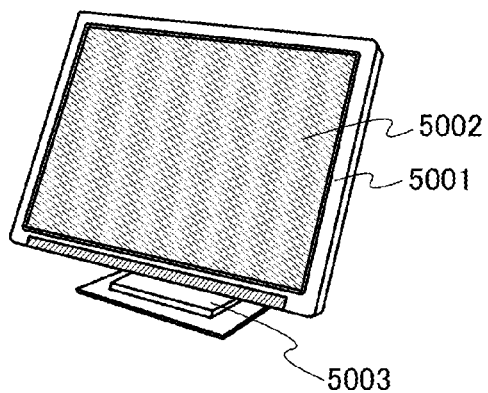
FIGS. 16A to 16F each illustrate an electronic device.

FIG. 16A illustrates a display device, which includes a housing 5001, a display portion 5002, a support 5003, and the like. It is possible to use the semiconductor display device according to one embodiment of the present invention as the display portion 5002. Note that the display device means all display devices for displaying information, such as display devices for personal computers, for receiving TV broadcast, and for displaying advertisements.

Figure 16B:
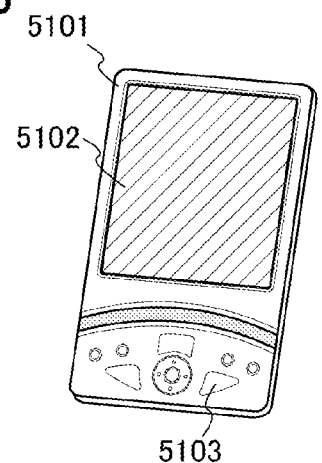

FIG. 16B illustrates a portable information terminal, which includes a housing 5101, a display portion 5102, operation keys 5103, and the like. It is possible to use the semiconductor display device according to one embodiment of the present invention as the display portion 5102.

Figure 16C:
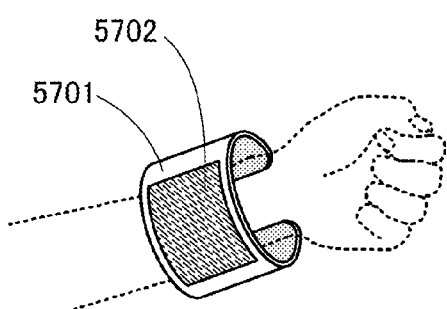

FIG. 16C illustrates a display device, which includes a housing 5701 having a curved surface, a display portion 5702, and the like. When a flexible substrate is used for the semiconductor display device according to one embodiment of the present invention, it is possible to use the semiconductor display device as the display portion 5702 supported by the housing 5701 having a curved surface. Consequently, it is possible to provide a user-friendly display device that is flexible and lightweight.

Figure 16D:
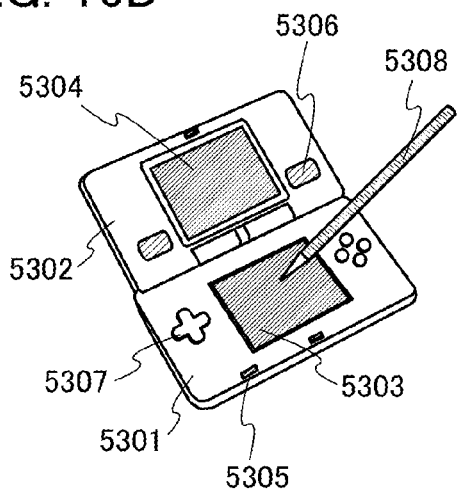

FIG. 16D illustrates a portable game machine, which includes a housing 5301, a housing 5302, a display portion 5303, a display portion 5304, a microphone 5305, speakers 5306, operation keys 5307, a stylus 5308, and the like. It is possible to use the semiconductor display device according to one embodiment of the present invention as the display portion 5303 or 5304. When the semiconductor display device according to one embodiment of the present invention is used as the display portion 5303 or 5304, it is possible to provide a user-friendly portable game machine with quality that hardly deteriorates. Note that although the portable game machine in FIG. 16D includes two display portions 5303 and 5304, the number of display portions included in the portable game machine is not limited to two.

Figure 16E:
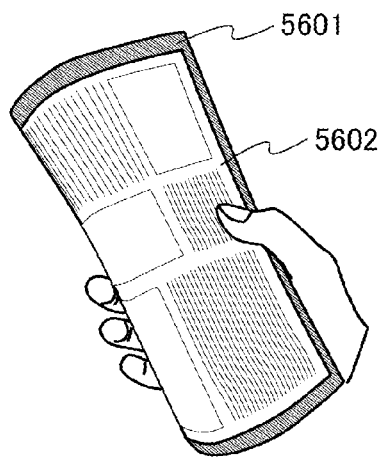

FIG. 16E illustrates an e-book reader, which includes a housing 5601, a display portion 5602, and the like. It is possible to use the semiconductor display device according to one embodiment of the present invention as the display portion 5602. When a flexible substrate is used, the semiconductor display device can have flexibility, so that it is possible to provide a flexible and lightweight e-book reader.

Figure 16F:
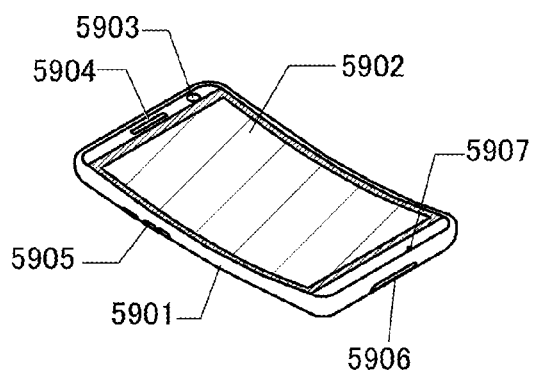

FIG. 16F illustrates a cellular phone, which includes a display portion 5902, a microphone 5907, a speaker 5904, a camera 5903, an external connection port 5906, and an operation button 5905 in a housing 5901. It is possible to use the semiconductor display device according to one embodiment of the present invention as the display portion 5902. When the semiconductor display device according to one embodiment of the present invention is provided over a flexible substrate, the semiconductor display device can be used as the display portion 5902 having a curved surface, as illustrated in FIG. 16F.

This application is based on Japanese Patent Application serial No. 2013-150414 filed with Japan Patent Office on Jul. 19, 2013, the entire contents of which are hereby incorporated by reference.

What is claimed is:
1. A semiconductor device comprising:
a light-receiving element;
a first transistor;
a second transistor;
a third transistor;
a CPU; and
a controller,
wherein one of electrodes of the light-receiving element is electrically connected to a node,
wherein one of a source electrode and a drain electrode of the first transistor is electrically connected to the node,
wherein a gate of the second transistor is electrically connected to the node,
wherein one of a source and a drain of the third transistor is electrically connected to one of a source and a drain of the second transistor,
wherein the other of the source and the drain of the third transistor is electrically connected to a wiring,
wherein the wiring is electrically connected to the CPU,
wherein the CPU is electrically connected to the controller,
wherein the controller is electrically connected to a gate of the first transistor,
wherein the first transistor comprises an oxide semiconductor layer in a channel formation region,
wherein an oxide layer containing oxygen at a proportion higher than a stoichiometric composition is located over the source electrode, the drain electrode and the oxide semiconductor layer,
wherein the CPU is configured to select a first driving method in which a third potential which is higher than a first potential and lower than a second potential is supplied to the gate of the first transistor in accordance with an external light intensity,
wherein the controller is configured to supply the third potential to the gate of the first transistor in accordance with a result of a selection of the CPU,
wherein the first potential makes the first transistor be in an off state, and
wherein the second potential makes the first transistor be in an on state.

2. The semiconductor device according to claim 1, wherein the oxide semiconductor layer comprises In, Ga, and Zn.

3. The semiconductor device according to claim 1,
wherein the oxide semiconductor layer comprises a crystal region, and
wherein c-axes of the crystal region are aligned in a direction substantially perpendicular to a bottom surface or a top surface of the oxide semiconductor layer.

4. The semiconductor device according to claim 1, wherein the second transistor comprises silicon in a channel formation region.

5. An imaging device comprising:
a sensor circuit comprising:
a light-receiving element;
a first transistor;
a second transistor; and
a third transistor;
a CPU; and
a circuit,
wherein one of electrodes of the light-receiving element is electrically connected to a node,
wherein the first transistor is electrically connected between a first wiring and the node,
wherein a gate of the second transistor is electrically connected to the node,
wherein one of a source and a drain of the third transistor is electrically connected to one of a source and a drain of the second transistor,
wherein the other of the source and the drain of the second transistor is electrically connected to a second wiring,
wherein the other of the source and the drain of the third transistor is electrically connected to and a third wiring,
wherein the third wiring is electrically connected to the CPU,
wherein the CPU is electrically connected to the circuit,
wherein the circuit is electrically connected to a gate of the first transistor,
wherein the CPU is configured to select a first driving method in which a third potential which is higher than a first potential and lower than a second potential is supplied to the gate of the first transistor in accordance with an external light intensity,
wherein the circuit is configured to supply the third potential to the gate of the first transistor in accordance with a result of a selection of the CPU,
wherein the first potential makes the first transistor be in an off state, and
wherein the second potential makes the first transistor be in an on state.

6. The imaging device according to claim 5, wherein the first transistor comprises an oxide semiconductor layer in a channel formation region.

7. The imaging device according to claim 6, wherein the oxide semiconductor layer comprises In, Ga, and Zn.

8. The imaging device according to claim 6,
wherein the oxide semiconductor layer comprises a crystal region, and
wherein c-axes of the crystal region are aligned in a direction substantially perpendicular to a bottom surface or a top surface of the oxide semiconductor layer.

9. The imaging device according to claim 6,
wherein the first transistor includes a pair of gates which is electrically connected to each other and overlaps each other with the oxide semiconductor layer interposed therebetween, and
wherein an end portion of the oxide semiconductor layer in a channel width direction overlaps the pair of gates.

10. A semiconductor display device comprising:
a light-emitting element;
a sensor circuit comprising:
a light-receiving element;
a first transistor;
a second transistor; and
a third transistor;
a CPU; and
a circuit,
wherein one of electrodes of the light-receiving element is electrically connected to a node,
wherein the first transistor is electrically connected between a first wiring and the node,
wherein a gate of the second transistor is electrically connected to the node,
wherein one of a source and a drain of the third transistor is electrically connected to one of a source and a drain of the second transistor,
wherein the other of the source and the drain of the second transistor is electrically connected to a second wiring,
wherein the other of the source and the drain of the third transistor is electrically connected to and a third wiring,
wherein the third wiring is electrically connected to the CPU,
wherein the CPU is electrically connected to the circuit,
wherein the circuit is electrically connected to a gate of the first transistor,
wherein the CPU is configured to select a first driving method in which a third potential which is higher than a first potential and lower than a second potential is supplied to the gate of the first transistor in accordance with an external light intensity,
wherein the circuit is configured to supply the third potential to the gate of the first transistor in accordance with a result of a selection of the CPU,
wherein the first potential makes the first transistor be in an off state,
wherein the second potential makes the first transistor be in an on state, and
wherein luminance of the light-emitting element is controlled by an image signal.

11. The semiconductor display device according to claim 10, wherein the first transistor comprises an oxide semiconductor layer in a channel formation region.

12. The semiconductor display device according to claim 11, wherein the oxide semiconductor layer comprises In, Ga, and Zn.

13. The semiconductor display device according to claim 11,
wherein the oxide semiconductor layer comprises a crystal region, and
wherein c-axes of the crystal region are aligned in a direction substantially perpendicular to a bottom surface or a top surface of the oxide semiconductor layer.

14. The semiconductor display device according to claim 11,
wherein the first transistor includes a pair of gates which is electrically connected to each other and overlaps each other with the oxide semiconductor layer positioned therebetween, and
wherein an end portion of the oxide semiconductor layer in a channel width direction overlaps the pair of gates.

* * * * *